US006825785B1

(12) United States Patent
Huang et al.

(10) Patent No.: US 6,825,785 B1
(45) Date of Patent: Nov. 30, 2004

(54) DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR

(75) Inventors: Yunteng Huang, Austin, TX (US); Bruno W. Garlepp, Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 10/188,576

(22) Filed: Jul. 2, 2002

Related U.S. Application Data

(60) Provisional application No. 60/360,333, filed on Feb. 28, 2002, provisional application No. 60/360,461, filed on Feb. 28, 2002, provisional application No. 60/360,310, filed on Feb. 28, 2002, and provisional application No. 60/360,340, filed on Feb. 28, 2002.

(51) Int. Cl.[7] ........................... H03M 1/00; H03M 1/66
(52) U.S. Cl. ....................................... 341/141; 341/144
(58) Field of Search ................................ 341/141, 139, 341/143, 144, 61; 327/291, 7; 330/9; 331/1 A, 117 R, 179; 455/324; 345/98

(56) References Cited

U.S. PATENT DOCUMENTS

| | | | | |
|---|---|---|---|---|
| 5,012,244 A | | 4/1991 | Wellard et al. | |
| 5,036,294 A | | 7/1991 | McCaslin | |
| 5,200,750 A | | 4/1993 | Fushiki et al. | |
| 5,754,072 A | * | 5/1998 | Mazzetti | 327/291 |
| 6,137,372 A | | 10/2000 | Welland et al. | |
| 6,147,567 A | | 11/2000 | Welland et al. | |
| 6,344,814 B1 | * | 2/2002 | Lin et al. | 341/144 |
| 6,385,443 B1 | | 5/2002 | Lee et al. | |
| 6,400,298 B1 | * | 6/2002 | Lee | 341/144 |
| 6,515,540 B1 | | 2/2003 | Prasad et al. | |
| RE38,083 E | * | 4/2003 | Ashe | 341/139 |
| 6,556,159 B1 | | 4/2003 | Fei et al. | |
| 6,580,376 B2 | | 6/2003 | Perrott | |
| 6,590,426 B2 | | 7/2003 | Perrott | |
| 6,646,581 B1 | * | 11/2003 | Huang | 341/143 |
| 6,750,839 B1 | * | 6/2004 | Hogan | 345/98 |
| 2002/0008593 A1 | | 1/2002 | Gomez et al. | |
| 2002/0135428 A1 | | 9/2002 | Gomez | |
| 2003/0016088 A1 | | 1/2003 | Scheffler | |

* cited by examiner

*Primary Examiner*—Patrick Wamsley
(74) *Attorney, Agent, or Firm*—Zagorin, O'Brien & Graham, LLP

(57) ABSTRACT

An exemplary PLL circuit includes a VCO responsive to a plurality of sub-varactor control signals. A digital loop filter for the PLL digitally generates a varactor control word, which is digitally expanded into a plurality of digital values, each of which is conveyed to a corresponding one of a plurality of DACs. A multiplexer is configured to respectively convey the DAC output signals to a group of sub-varactor control signals according to the varactor control word, and to drive remaining sub-varactor control signals to either the full-scale high value or the full-scale low value of the DAC outputs. Each of the DACs preferably includes a hybrid first order/second order sigma-delta modulator, and in certain embodiments, a NRZ-to-RZ coder circuit, and a linear filter circuit.

13 Claims, 27 Drawing Sheets

| i (BIT POSITION): | [0 | 1 | 2 | 3 | ... | 22 | 23 | 24 | 25 | 26 | 27 | 28 | 29 | 30 | 31 | 32 | 33 | ... | 125 | 126 | 127] |
|---|---|---|---|---|---|---|---|---|---|---|---|---|---|---|---|---|---|---|---|---|---|
| SEL_DAC [i] | 0 | 0 | 0 | 0 | ... | 0 | 0 | 1 | 1 | 1 | 1 | 1 | 1 | 1 | 0 | 0 | 0 | ... | 0 | 0 | 0 |
| SEL_RAIL [i] | 1 | 1 | 1 | 1 | ... | 1 | 1 | 1 | 1 | 1 | 1 | 1 | 1 | 1 | 0 | 0 | 0 | ... | 0 | 0 | 0 |

IF SEL_DAC[i] = 1 → SELECT CORRESPONDING DAC OUTPUT (IGNORE SEL_RAIL [i])

IF SEL_DAC[i] = 0 → COUPLE OUTPUT TO FOLLOW SEL_RAIL[i]

FIG. 13

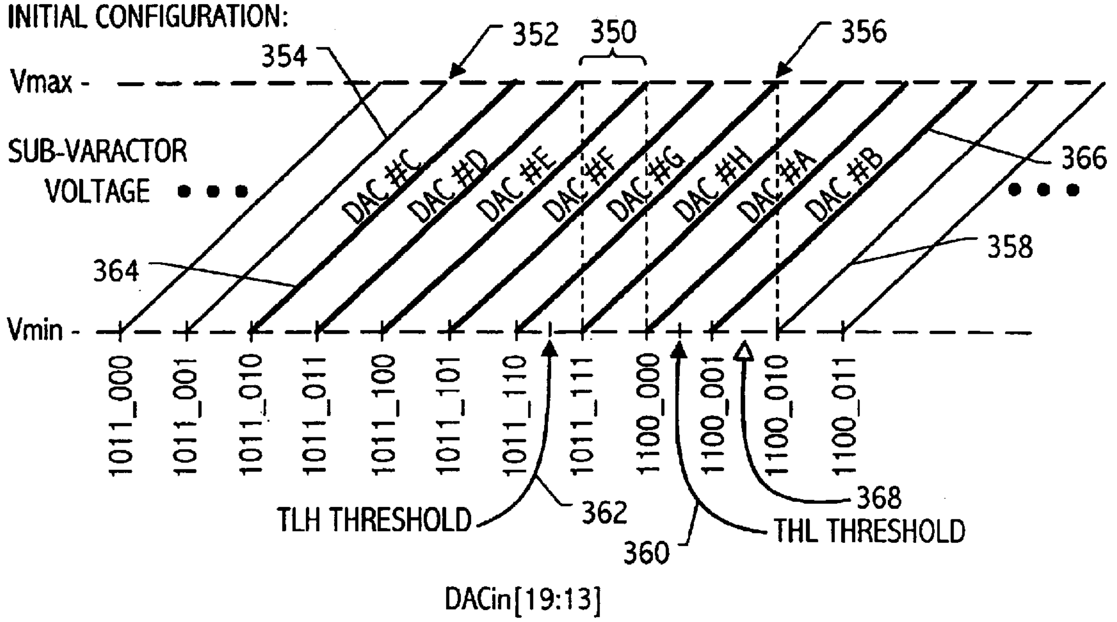

previous int[19:0] = 1100_0000_0100_0110_1100 ( < THL threshold)

current int[19:0] = 1100_0001_0010_1100_0100 ( >= THL threshold)
fFwd[19:0] = 0000_0010_0000_0000_0000 (most positive value)
DACin[19:0] = 1100_0011_0010_1100_0100 state = 00 (NT = Not Transitioning any of the sub-DACs)

firstDAC = 010 (#C) firstDACaddr = 1011_010 dacPosA = 110 dacPosB =111 dacPosC = 000 dacPosD = 001
dacPosE = 010 dacPosF = 011 dacPosG = 100 dacPosH = 101 dacStateA = 0001 dacStateB = 0000 dacStateC = 0111 dacStateD = 0110
dacStateE = 0101 dacStateF = 0100 dacStateG = 0011 dacStateH = 0010 dacValA = 0011_0010_1100_0100 dacValB = 0001_0010_1100_0100
dacValC = 1000_0000_0000_0000 dacValD = 1000_0000_0000_0000
dacValE = 1000_0000_0000_0000 dacValF = 1000_0000_0000_0000
dacValG = 0111_0010_1100_0100 dacValH = 0101_0010_1100_0100

FIG. 16

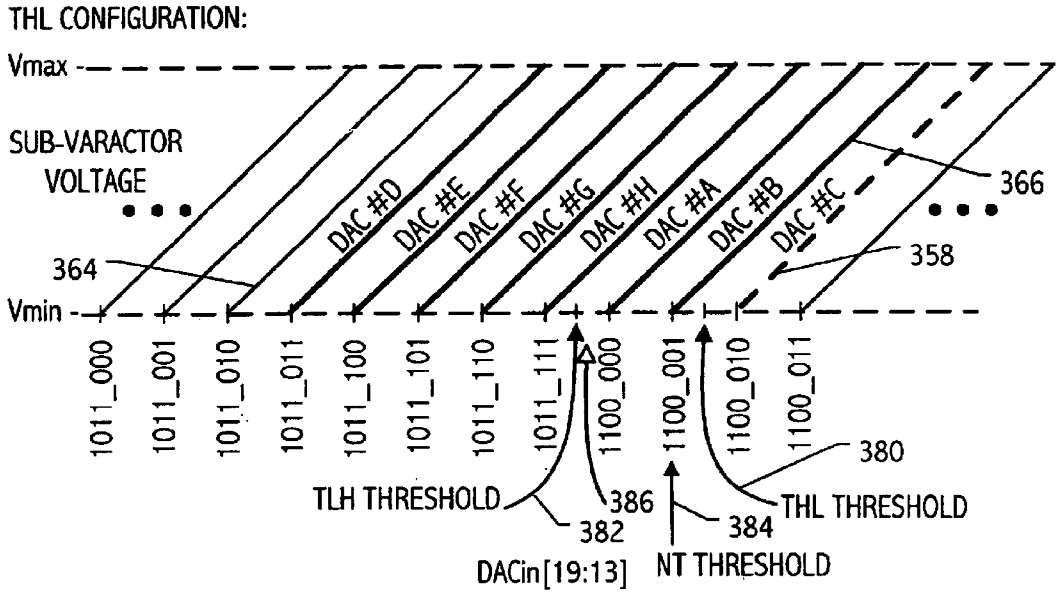

current int[19:0] = 1100_0001_1010_1000_0110 ( < NT threshold)
fFwd[19:0] = 1111_1110_0000_0000_0000 (most negative value)
DACin[19:0] = 1011_1111_1010_1000_0110 state = 11 (THL = a sub-DAC is Transitioning from High to Low)

firstDAC = 011 (#D) firstDACaddr = 1011_011 dacPosA = 101 dacPosB = 110 dacPosC = 111 dacPosD =000
dacPosE = 001 dacPosF = 010 dacPosG = 011 dacPosH =100 dacStateA = 1111 dacStateB = 1110 dacStateC = 1101 dacStateD = 0100
dacStateE = 0011 dacStateF = 0010 dacStateG = 0001 dacStateH = 0000 dacValA = 0000_0000_0000_0000 dacValB = 0000_0000_0000_0000
dacValC = 0000_0000_0000_0000 dacValD = 1000_0000_0000_0000
dacValE = 0111_1010_1000_0110 dacValF = 0101_1010_1000_0110
dacValG = 0011_1010_1000_0110 dacValH = 0001_1010_1000_0110

FIG. 17

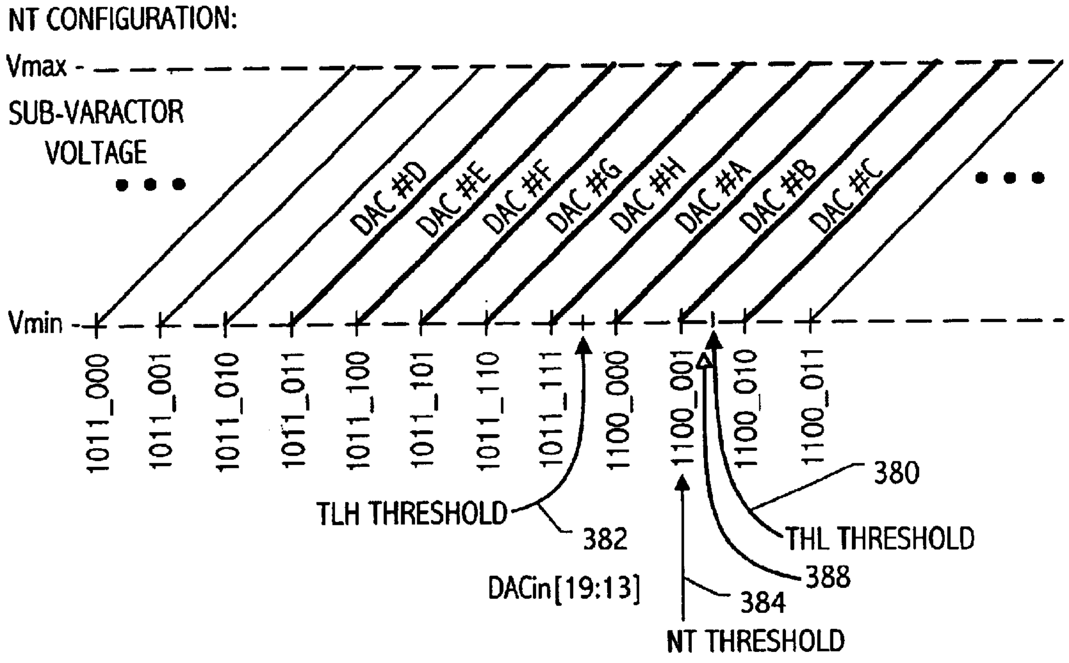

current int[19:0] = 1100_0010_0100_0011_0010 ( > NT threshold)
fFwd[19:0] = 0000_0000_0000_0000_0000
DACin[19:0] = 1100_0010_0100_0011_0010 state = 00 (NT = Not Transitioning any of the sub-DACs)

firstDAC = 011 (#D) firstDACaddr = 1011_011 dacPosA = 101 dacPosB = 110 dacPosC = 111 dacPosD =000
dacPosE = 001 dacPosF = 010 dacPosG = 011 dacPosH =100 dacStateA = 0001 dacStateB = 0000 dacStateC = 1111 dacStateD = 0110
dacStateE = 0101 dacStateF = 0100 dacStateG = 0011 dacStateH = 0010 dacValA = 0001_0100_0011_0010 dacValB = 0000_0100_0011_0010
dacValC = 0000_0000_0000_0000 dacValD = 1000_0000_0000_0000
dacValE = 1000_0000_0000_0000 dacValF = 1000_0000_0000_0000
dacValG = 0111_0100_0011_0010 dacValH = 0101_0100_0011_0010

FIG. 18

STATE DIAGRAM: NT = Not Transitioning any of the sub-DACs
THL = a sub-DAC is Transitioning from High to Low
TLH = a sub-DAC is Transitioning from High to Low

```
module varactorDAC (dacVal, sdLimitLo, sdLimitHi, bitstreamMode, clk78, reset_b,
             dac_1b, dacTst_1b);;
//-------------------------------------------------------------- 570 ----
// Module Interface Variables
//-----------------------------------------------------------------------
input   [15 : 0} dacVal;  // 16-Bit input value for driving this varactor sub-DAC
input    bitstreamMode;   // Indicates digital bitstream test mode
input  [2:0] sdLimitLo;   // Thresholds for switching between 1st/2nd order
                          // sigma-delta
input  [2:0] sdLimitHi;   // DAC operation
input  clk78;             // VCO-based clock (typically 77.75MHz)
input reset_b;            // Chip reset (active low)

output dac_1b;            // One-bit delta-sigma output bistream
output dacTst_1b;         // Replica of dac_1b for digital bitstream test mode

reg dac_1b;
                                                          572
//-----------------------------------------------------------------------
// Module Internal Variables
//-----------------------------------------------------------------------
wire [7 : 0] accumSum;         // Truncated sum of accum1 and accum2: used to
                               // determine the value of dac_1b
wire [16:0] accum2Sum;         // Intermediate sum used to prevent the 2nd
                               // accumulator from over- or under-flowing
reg [15 : 0] accum1, accum2;   // Signed 1st order and 2nd order delta-
                               // sigma accumulators
                                                                574
//-----------------------------------------------------------------------
// Sign-extend the 7 MSBs of accum1 and accum2 and add them. This sum will
// determine if the sub-DAC's output should be a "0" or a "1".
//-----------------------------------------------------------------------
assign accumSum = {accum1 [15], accum1 [15 : 9]} +
    {accum2 [15], accum2 [15 : 9]};
```

FIG. 25A

```
//----------------------------------------------------------------
// Implement the first order delta-sigma logic and the output comparator that
//  produces the 1-bit output stream.  Also, produce the test mode output.
//------------------------------------------------------------------
always @ (posedge clk78 or negedge reset_b)
  if  (!reset_b)                    // Asynchronous Reset
    begin
      accum1  <=  16'h0000;
      dac_1b  <= 1'b0;
 end
else
  if (accumSum [7] == 1 'b1)   <-- 576
    begin
      accum1  <= accum1  +  dacVal;      } 578
      dac_1b  <= 1 'b0;
    end
  else
    begin
      accum1  <= accum1  +  { ~dacVal [15], dacVal [14:0]};   } 580
      dac_1b  <=  1 'b1;
    end

assign dacTst_1b  =  (bitstreamMode) ? dac_1b : 1 'b0;
```

FIG. 25B

```
//-------------------------------------------------------------
// Implement the second order delta-sigma logic: If the input value is close to
// zero or full scale, degrade the sub-DAC to first order by forcing the second
// accumulator to zero. Otherwise, operate the sub-DAC as a second order;
// delta-sigma DAC by adding a scaled version of the first accumulator (1/8
// scaling factor) to the second accumulator. The second accumulator must
// never over- or under-flow.
//-------------------------------------------------------------
assign accum2Sum = {accum2[15],accum2[15:0]} +
                   {accum1[15],accum1[15],accum1[15],
                    accum1[15],accum1[15:3]};                          } 584

always @ (posedge clk78 or negedge reset_b)
  if (!reset_b)                      // Asynchronous Reset
    accum2  <= 16'h0000;

 else
   if ((dacVal[15:10] <= {3'b000,sdLimitLo}) || (dacVal[15:10] >=
       {3'b011,sdLimitHi}))
     accum2 <= 16'h0000;                                               } 582
   else
    case ({accum2Sum[16:15]})
      2'b00 : accum2 <= accum2Sum[15:0]; // Normal positive result
      2'b01 : accum2 <= 16'h7fff;        // Limit positive
      2'b10 : accum2 <= 16'h8000;        // Limit negative             } 583
      2'b11 : accum2 <= accum2Sum[15:0]; // Normal negative result
    endcase

endmodule
```

FIG. 25C

| |
|---|
| 25A |
| 25B |
| 25C |

FIG. 25

DIGITAL EXPANDER APPARATUS AND METHOD FOR GENERATING MULTIPLE ANALOG CONTROL SIGNALS PARTICULARLY USEFUL FOR CONTROLLING A SUB-VARACTOR ARRAY OF A VOLTAGE CONTROLLED OSCILLATOR

CROSS-REFERENCE TO RELATED APPLICATION(S)

This application is entitled to the benefit of U.S. Provisional Application No. 60/360,333 filed Feb. 28, 2002, U.S. Provisional Application No. 60/360,461, filed Feb. 28, 2002, U.S. Provisional Application No. 60/360,310, filed Feb. 28, 2002, U.S. Provisional Application No. 60/360,340, filed Feb. 28, 2002, each of which is hereby incorporated by reference in its entirety.

This application is related to co-pending U.S. patent application Ser. No. 10/188,784 by Yunteng Huang, filed on even date herewith, entitled "Digital-to-Analog Converter Circuit Incorporating Hybrid Sigma-Delta Modulator Circuit".

REFERENCE TO COMPUTER PROGRAM LISTING APPENDIX

A Computer Program Listing Appendix is filed herewith on compact disk, the material of which is hereby incorporated by reference in its entirety. The compact disk is submitted in duplicate (labeled COPY 1 and COPY 2) and each of the two identical disks contains a file named "dacExpander.txt" having a file size of 28,728 bytes (29 kb) and having a file creation date of Apr. 17, 2002.

COPYRIGHT NOTICE

A portion of the disclosure of this patent document, including certain figures and the Computer Program Listing Appendix, contains material which is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

BACKGROUND

1. Field of the Invention

This invention relates to the generation of multiple control signals, and particularly to those useful for controlling a sub-varactor array of a voltage controlled oscillator such as in a phase-locked loop circuit.

2. Description of Problem to be Solved and Related Art

Phase locked loops (PLLs) have been known and studied for quite some time. Initially they were very expensive to implement, and found use in only the most technically-demanding and/or cost-insensitive applications. However, as the cost of integrated circuit technology has decreased over the years, and as the performance capability of such integrated circuit technology has increased, today PLLs are extremely inexpensive to implement and are found in wide use in many applications.

Within a traditional PLL, a filter block is frequently included to low-pass filter an output signal of a phase/frequency detector to generate a control signal for a voltage controlled oscillator (VCO) in order to influence the frequency (and hence the phase) of the VCO output signal. The filter block is often implemented using a charge pump and one or more loop filter capacitors, as is well known in the art. Such loop filter capacitors may be required to be very large for the PLL to exhibit acceptable peaking behavior in its frequency response.

Moreover, for certain applications, the loop bandwidth may need to be extremely low, including as low as 100 Hz. Achieving a bandwidth this low is very difficult using traditional techniques, and may require large capacitors which are difficult to integrate onto an integrated circuit without requiring large amounts of die area. For this reason, a loop filter capacitor is frequently provided externally. But such an external capacitor adds an additional complexity to board layout, and introduces noise susceptibility on the extremely critical loop filter node within the PLL.

SUMMARY OF THE INVENTION

Digital techniques for implementing a PLL loop filter may be utilized to digitally integrate a digital phase error signal to yield a digital signal representing the integrated phase error signal, and thereby reduce substantially the capacitors which must be integrated of are desired. But such a digital signal may still need to be converted to one or more analog signals to control a VCO. Improved conversion circuits and techniques are still greatly desired.

An exemplary PLL circuit includes a VCO responsive to a plurality of sub-varactor control signals. A digital loop filter for the PLL digitally generates a varactor control word, which is digitally expanded into a plurality of digital values, each of which is conveyed to a corresponding one of a plurality of DACs. In certain embodiments a multiplexer is configured to respectively convey or steer the DAC output signals to a group of sub-varactor control signals according to the varactor control word, and to drive remaining sub-varactor control signals to either the full-scale high value or the full-scale low value of the DAC outputs. In other embodiments, a dedicated DAC may be provided for each sub-varactor control signal and a multiplexer not utilized.

Preferably each of the one or more DACs include a hybrid first order/second order sigma-delta modulator to advantageously achieve the lower noise properties of a second order modulator, but also achieve full-scale output range of a first order modulator. When the analog output voltage of a DAC is at a value either at or near the top or bottom voltage rail (i.e., at or near the desired output range), the sigma-delta modulator is preferably operated as a first order modulator to achieve a full-scale output range, but otherwise the sigma-delta modulator is configured to operate as a second order modulator to achieve the lower noise properties. In certain embodiments, each of the DACs preferably includes an NRZ-to-RZ coder circuit and a linear filter circuit.

In an exemplary embodiment of the invention, 128 control signals are generated using only 8 DACs. The varactor control word may be used to determine which 8 of the 128 control signals are coupled by a multiplexer to the DACs, as well as the digital value communicated to each DAC. The multiplexer preferably couples each of the remaining control signals "below" the selected group to one of the DAC voltage rails, and couples the remaining control signals "above" the selected group to the other of the DAC voltage rails. As the varactor control word changes sufficiently in value, a DAC from one end of the selected group of control signals may be "rolled" or switched to drive a new control signal at the other end of the newly selected group of control signals. In an exemplary embodiment, at most only four of the eight DACs generate intermediate voltages between the DAC voltage rails. When a DAC is about to be rolled, its output is already at one of the two DAC voltage rails, and the control signal coupled thereto may be instead coupled by the multiplexer directly to the DAC voltage rail without glitching the control signal. Then the DAC may be driven to the other voltage rail, its output allowed to settle, and then coupled to a new control signal at the other end of the newly selected group of 8 control signals In other embodiments the analog value of each control signal may be determined by a varactor control word, but the selection of which control signals are driven by DACs or driven directly by the multiplexer to a voltage rail may be determined by another control word. For example, the varactor control word may be generated by adding a PLL loop filter feed-forward value to a PLL loop filter integrating path value, whereas the selection may be based only upon the PLL loop filter integrating path value, which is a lower frequency component of the varactor control word.

BRIEF DESCRIPTION OF THE DRAWINGS

The present invention may be better understood, and its numerous objects, features, and advantages made apparent to those skilled in the art by referencing the accompanying drawings.

FIG. 13 is a diagram illustrating useful behavior of certain signals shown in FIG. 11.

FIG. 16, FIG. 17, and FIG. 18 are diagrams illustrating, for the multiple DACs depicted in FIG. 11, exemplary operation of rolling a DAC in response to a sufficiently large change in the digital loop filter value.

FIG. 25 (being FIG. 25A, FIG. 25B, and FIG. 25C) is a coded representation of preferred embodiments of a hybrid first order/second order sigma-delta modulator circuit.

The use of the same reference symbols in different drawings indicates similar or identical items.

DESCRIPTION OF THE PREFERRED EMBODIMENT(S)

Figure 1:
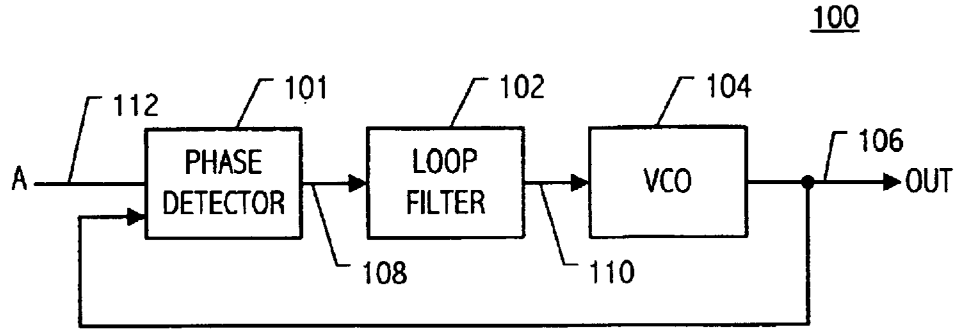
FIG. 1 is a block diagram representing a phase locked loop (PLL) circuit.

Referring now to FIG. 1, a block diagram of a phase locked loop (PLL) circuit 100 is shown by way of illustration which includes a phase detector 101, a loop filter 102, and a voltage controlled oscillator (VCO) 104. The phase detector 101 receives an input signal A conveyed on node 112 and a clock signal from the VCO 104 which is conveyed on node 106, and generates on an output node 108 an error signal typically representing the phase difference between the two input signals. The output 108 of the phase detector 101 is provided to the loop filter 102, and the output 110 of the loop filter 102 is provided to the VCO 104. As would be known, other PLL components or different PLL components may be utilized in the phase locked loop circuit 100. For example, a phase/frequency detector may be utilized instead of a phase detector. Various loop filter configurations and VCO configurations may also be employed, as well as other types of controlled oscillators, such as current-controlled oscillators. Moreover, the second input signal to the phase detector 101 may be derived from the VCO output signal 106, such as a divided-down version of the VCO output signal 106 (not shown).

Figure 2:
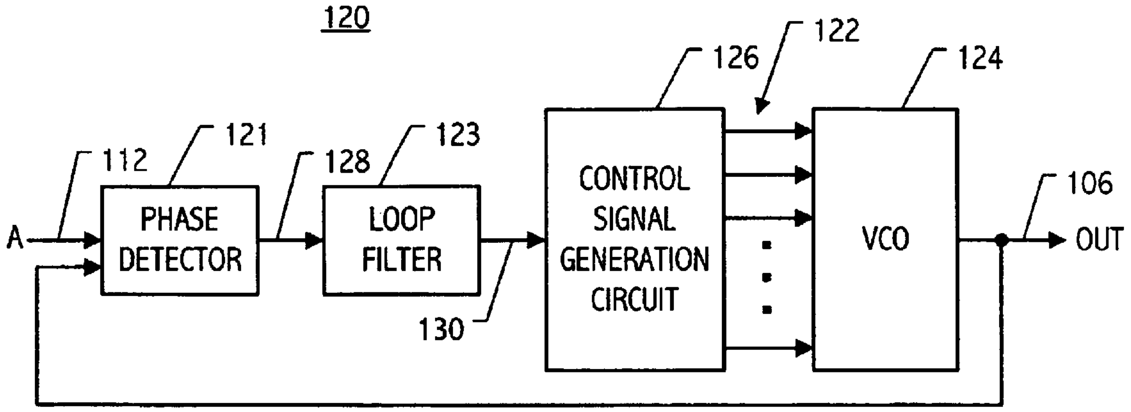
FIG. 2 is a block diagram representing a PLL circuit which generates multiple control signals to control the VCO.
Figure 4:
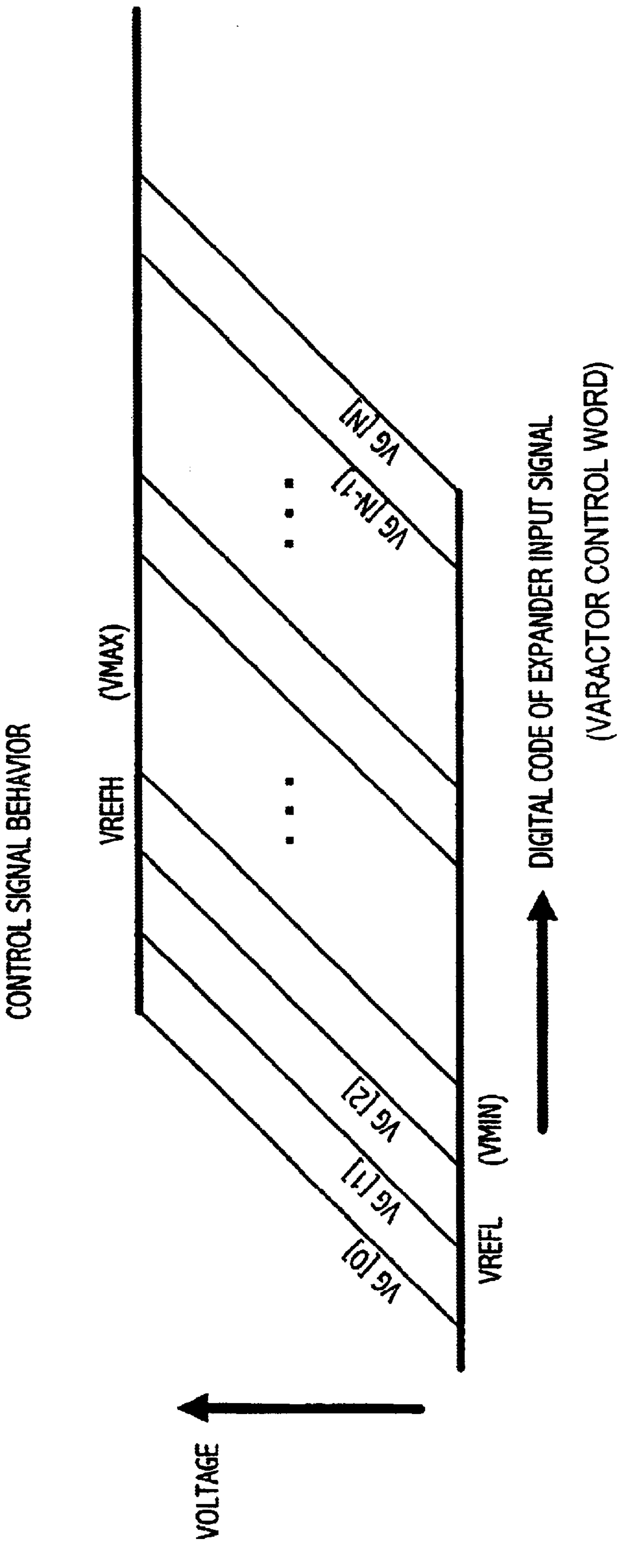
FIG. 4 is a diagram illustrating useful behavior of the multiple control signals for the circuit shown in FIG. 2.

FIG. 2 illustrates an alternative PLL circuit 120 that utilizes multiple control input signals 122 to control a VCO 124. When utilizing a voltage controlled oscillator having multiple control inputs, the various control input signals 122 may be generated by a control signal generator circuit 126 which receives the output signal 130 from the loop filter 123. Exemplary voltage levels for each control signal 122 are shown in FIG. 4 for up to N+1 control signals 122. As shown in FIG. 4, the voltage levels for a given control signal 122 may range from a low voltage reference level VREFL to a high voltage reference level VREFH and each control signal 122 is offset slightly from the adjacent control signals 122 for a given value of the input signal to the control signal generator circuit 126. It will be noted, however, that at any given time many of the control signals 122 may be at either the high voltage reference level VREFH (hereinafter sometimes called VMAX) or the low voltage reference level VREFL (hereinafter sometimes called VMIN). Thus, only a limited number of the control signals 122 may actually be operating at a voltage between the two reference levels at any given time. Exemplary PLL circuits utilizing voltage controlled oscillators having multiple input control signals are disclosed in U.S. Pat. No. 6,137,372 to Welland, U.S. patent application Ser. No. 09/902,541 by Perrott, et al., filed Jul. 10, 2001, U.S. patent application Ser. No. 09/902,542 by Perrott, filed Jul. 10, 2001, and U.S. patent application Ser. No. 09/902,548 by Perrott, filed Jul. 10, 2001, the disclosures of which are each expressly incorporated herein by reference.

As shown in FIG. 2, the PLL circuit 120 includes a phase detector circuit 121, a loop filter 123, a VCO control signal generation circuit 126 and the voltage controlled oscillator 124. The phase detector circuit 121 is preferably a digital phase detector such as those described in the above referenced U.S. patent application Ser. No. 09/902,542 by Perrott, et al. Other preferred examples are described in U.S. patent application Ser. No. 10/187,935, by Yunteng Huang, et. al., entitled "Method and Apparatus for Switching Between Input Clocks in a Phase-Locked Loop" and filed on even date herewith, which application is incorporated herein by reference. The loop filter 123 may be a digital loop filter as described in the above-referenced U.S. patent application Ser. No. 09/902,541 by Perrott, et al., and preferably may be a digital loop filter as described below. The VCO control signal generation circuit 126 may receive the digital output 130 of the loop filter 123 as an input and provide as an output a plurality of control signals 122. As shown herein the VCO control signal generation circuit 126 is described as a separate circuit block independent of the loop filter 123 and the VCO 124. However, it will be recognized that such a VCO control signal generation circuit may also be considered to be part of a more complex loop filter, part of a more complex VCO or even split between a loop filter and VCO.

Figure 3:
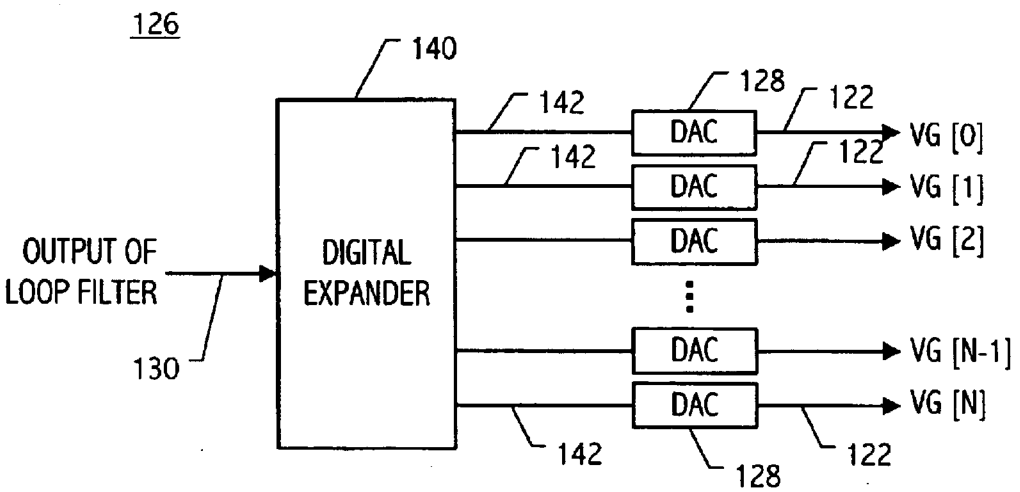
FIG. 3 is a block diagram representing an embodiment of a multiple control signal generation circuit useful for the circuit shown in FIG. 2.

In one embodiment the VCO control signal generation circuit 126 may include a digital to analog converter and a one-input/multiple-output analog voltage expander, examples of which are described in U.S. Provisional Application No. 60/300,699 by Baird, et al. filed Jun. 25, 2001, the disclosure of which is incorporated herein by reference. However, alternative VCO control signal generation techniques disclosed herein include the techniques shown in FIGS. 3 and 5. As shown in FIG. 3, the VCO control signal generation circuit 126 may receive a digital output signal 130 of the loop filter 123 (or other PLL circuitry). The digital signal 130 is then provided to a digital expander 140 that generates a plurality of digital signals 142 which are each digitally offset from each other by a predetermined digital amount. The digital signals 142 are then provided to a plurality of digital to analog converters (DACs) 128 that are utilized to convert each digital value 142 to a corresponding analog value on a corresponding control signal 122. Because the loop filter 123 is a digital loop filter preferably having a multi-bit digital output, the expansion of the single PLL control signal (i.e., the loop filter output conveyed on node 130) to multiple VCO control signals 142 is conveniently performed in the digital domain utilizing digital logic, including computing the offsets between adjacent signals and preferably limiting each signal 142 to a desired minimum or maximum value. These multiple digital control signals 142 are then converted to the analog VCO control signals 122 (also labeled VG[0], VG[1], VG[2], . . . VG[N]) preferably using a plurality of substantially identical DACs 128.

Voltage and temperature variations during normal operation will tend to shift the frequency of most any VCO. The PLL can compensate for these variations, but only if the varactor provides sufficient adjustment range. However, to reduce the jitter caused by noise on the VCO control node, the VCO gain (Kv) should be reduced and very fine control of the varactor control voltage should be provided. These are conflicting goals since a large control range typically requires a high Kv. To simultaneously accomplish these two competing design goals, a composite varactor comprised of 128 sub-varactors may be utilized. Each of the sub-varactors are turned on in an overlapping fashion, which provides for a large control range. The composite varactor is preferably driven by a 20-bit digital control word, which allows very fine increments across the large control range. However, it is typically not practical to build such a large number (128) of 20-bit DACs to directly drive the sub-varactors. Instead, the control range can be partitioned such that only 4 of the sub-varactors are actively driven to intermediate voltages at any time, and the remaining sub-varactors are either driven to their maximum or minimum level (as described in earlier figures). This results in a small Kv and reduced noise sensitivity at the VCO control port while preserving the large adjustment range. A preferred embodiment of such a scheme, which utilizes eight overlapping 16-bit sub-DACs, is described in greater detail below.

The circuit of FIG. 3 is well suited for applications having a relatively few number of control signals 122. However in applications utilizing many control signals 122, the use of a separate digital to analog converter 128 for each control signal 122 may require an undesirable amount of circuit area and/or consume an undesirable amount of power. Thus, another embodiment of the VCO control signal generation circuit 126 is shown conceptually in FIG. 5. This embodiment makes use of the observation (as described above) that only a limited number of the control signals 122 may actually be operating in the analog voltage region between the high voltage reference level VREFH or the low voltage reference level VREFL at any given time. All the remaining control signals 122 are at either the VREFH voltage or the VREFL voltage. Consequently, only a relatively small number of separate DACs need be provided compared to the total number of control signals 122.

Figure 5:
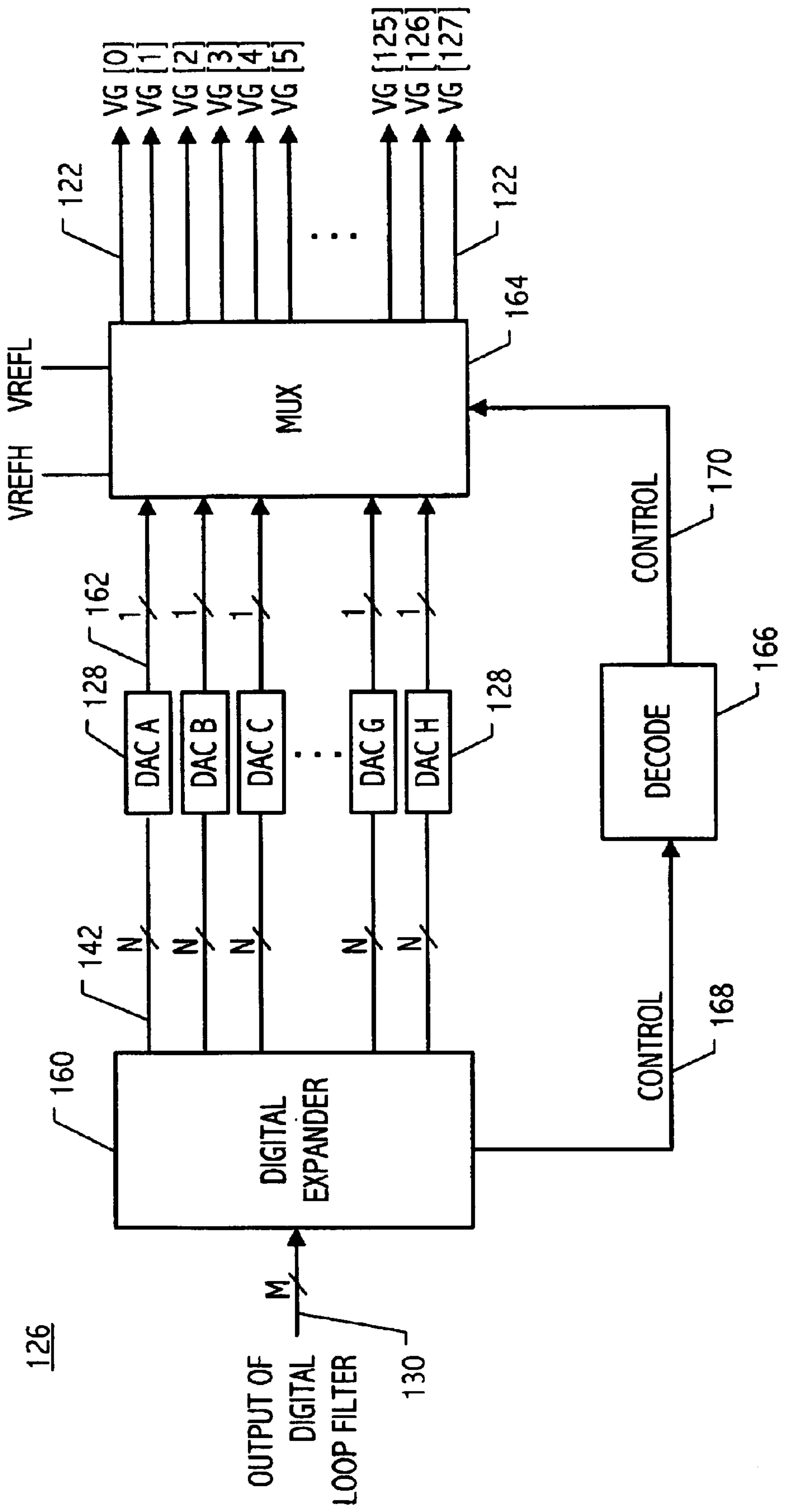
FIG. 5 is a block diagram representing another embodiment of a multiple control signal generation circuit useful for the circuit shown in FIG. 2.

In this exemplary embodiment of FIG. 5, the VCO control signal generation circuit 126 utilizes only eight digital to analog converters 128 (individually labeled DacA, DacB, DacC, . . . DacH) even though one-hundred twenty-eight (128) separate control signals 122 (individually labeled VG[0], VG[1], VG[2], . . . VG[127]) are generated and provided to the VCO. Most of the time eight of the control signals 122 are driven directly by an associated DAC 128, while the remaining one-hundred twenty (120) control signals 122 are driven to either the high voltage reference level VREFH or the low voltage reference level VREFL by the multiplexer 164. During other times when a particular DAC is switching from one associated control signal 122 to another associated control signal 122, only seven of the control signals 122 are driven directly by an associated DAC 128, as further described herebelow. A decoder circuit 166 receives control signals 168 from the digital expander 160 to determine which control signal 122 output nodes are coupled by the multiplexer 164 to the output node of a corresponding DAC 128, which control signal 122 output nodes are coupled to the high voltage reference level VREFH, and which control signal 122 output nodes are coupled to the low voltage reference level VREFL. Of course, it should be recognized that the techniques described herein may be utilized with a larger or smaller number of DACs and with a larger or smaller number of VCO control signals.

As shown in FIG. 5, the digital output 130 of the loop filter may be an M-bit digital word. In this embodiment, the digital expander 160 receives the M-bit digital input value and segregates the lower N-bits (i.e., the LSB segment) and the upper (M-N) bits (i.e., the MSB segment) of the M-bit digital input. The digital expander 160 then preferably expands the LSB segment of the input value into a plurality (e.g., eight) of different N-bit digital values on respective buses 142. The digital values on buses 142 are preferably uniformly offset from each other, subject to any maximum and minimum digital values that may be desired (see FIG. 4). The eight N-bit digital values (for this example) are then provided to eight respective digital to analog converters 128 which provide corresponding analog outputs signals 162 that are conveyed to the analog multiplexer circuit 164. As further described below, each digital to analog converter 128 preferably includes a hybrid second-order/first-order sigma-delta modulator and a second order low-pass RC filter, although many other configurations may be advantageously employed.

The multiplexer circuit 164 "steers" the eight analog signals 162 to the appropriate group of eight adjacent control signal lines 122. The multiplexer circuit 164 also receives the high voltage reference level VREFH which is coupled to each of the control signal lines to one side of the eight DAC-driven control signal lines (e.g., lower numbered control signals 122), and also receives the low voltage reference level VREFL which is coupled to each of the control signal lines to the other side of the eight DAC-driven control signal lines (e.g., higher numbered control signals 122). For example, control signals VG[71], VG[72], VG[73], . . . VG[78] maybe coupled to be respectively driven by the eight DACs 128, while the multiplexer circuit 164 drives control signals VG[0] through VG[70] to the high voltage reference level VREFH and drives control signals VG[79] through VG[127] to the low voltage reference level VREFL. Other steering circuits may be employed as well.

As the digital output 130 of the loop filter 123 changes, the decoder 166 "rolls up" or "rolls down" the DAC outputs to the appropriate control lines 122 in a stepwise fashion. Thus, using the example above, if the digital output 130 decreases by an appropriate digital increment, then the eight DAC outputs are muxed to control lines VG[70], VG[71], VG[72], . . . VG[77] respectively. In other words, the DAC 128 previously coupled to drive the VG[78] control signal is "rolled down" to next drive the VG[70] control signal instead (with, of course, a different digital input value applied initially to the DAC). In this fashion the eight DAC outputs may be moved up or down across the full range of the one-hundred twenty-eight (128) control lines 122 (also described as VG[127:0]). Additional details of an exemplary operation is provided below by way of a detailed description of a preferred embodiment.

Figure 6:
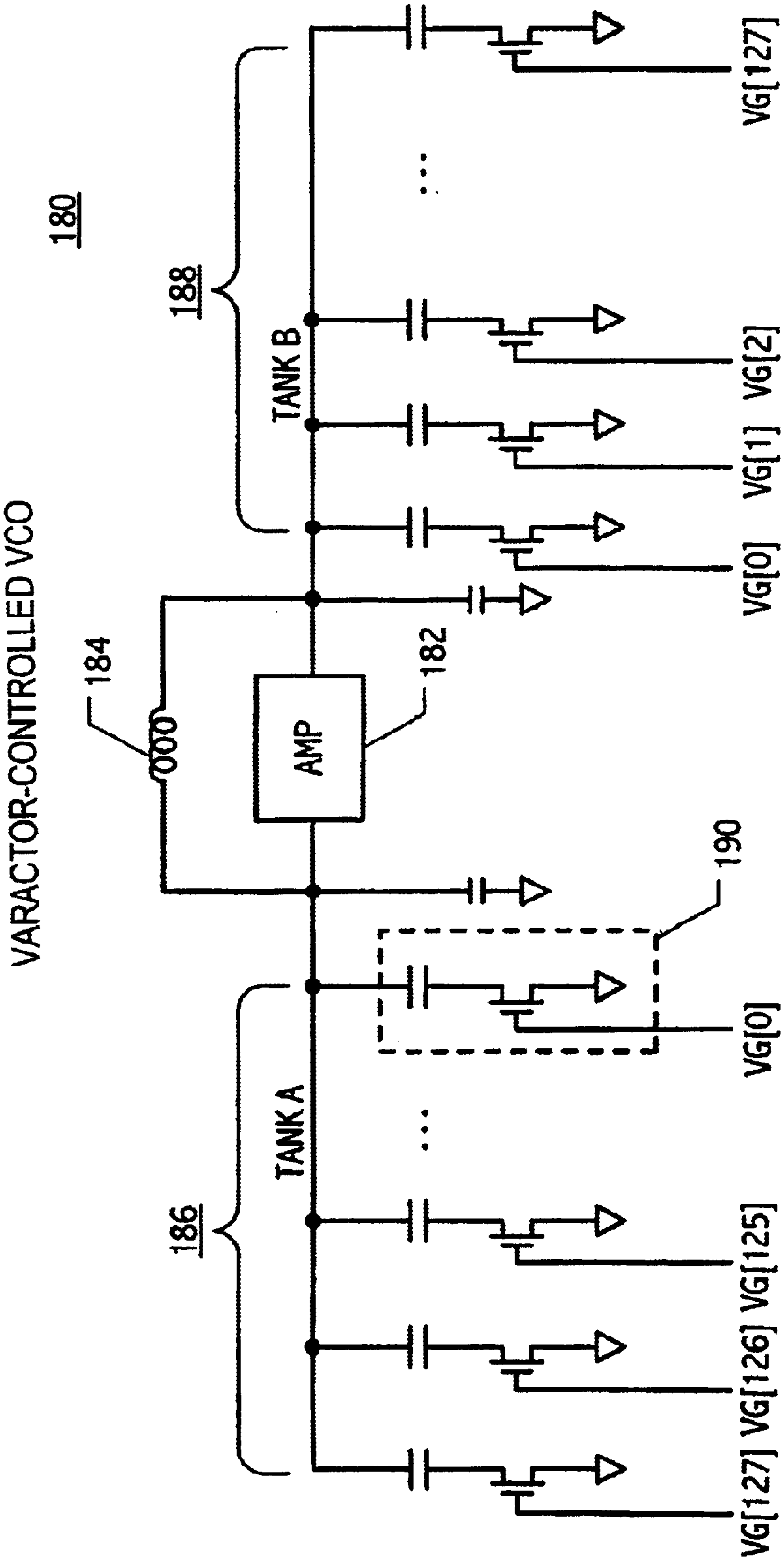
FIG. 6 is a circuit diagram representing an exemplary varactor circuit that utilizes multiple control signals to control the frequency of a VCO.

The control signal lines 122 may then be provided to a voltage controlled oscillator to adjust the output frequency of the oscillator. As is described in more detail herein, the voltage controlled oscillator may be of the type in which the frequency output is controlled through the addition or subtraction of capacitance within the voltage controlled oscillator. An example is an LC tank oscillator circuit 180 as depicted in FIG. 6, which includes an amplifier circuit 182 and a resonant LC circuit formed of an inductor 184 and a balanced pair of varactor circuits 186 and 188. Each such varactor circuit 186, 188 includes (for this example) one-hundred twenty-eight individual varactor circuits 190, each of which may also be termed a sub-varactor circuit. For this embodiment, each respective control signal VG[x] is coupled to a respective one of the individual sub-varactor circuits 190 within each of the two identical varactor circuits 186, 188. Other configurations of sub-varactor circuits within each varactor circuit may be utilized, and non-symmetrical configurations of varactor circuits may also be employed. Other preferred embodiments of varactor circuits, including non-balanced and/or non-symmetrical embodiments, are described in co-pending U.S. patent application Ser. No. 10/189,128 by Yunteng Huang, entitled "Imbalanced Differential Circuit Control" and filed on even date herewith, which application is incorporated herein by reference.

As represented herein, the capacitance adjustment circuitry may be considered part of the voltage controlled oscillator. As mentioned above, part or all of the VCO control signal generation circuitry 126 (such as the digital expander circuit shown in FIG. 5) may also be considered to be part of the voltage controlled oscillator. Conversely, part of the voltage controlled oscillator circuit may be considered to be a portion of the VCO control signal generation circuitry. For example, the capacitance adjustment circuitry for the VCO may instead be considered to be part of the VCO control signal generation circuitry shown herein to form a segmented circuit block. If viewed in such a manner, the VCO control signal generation circuitry and the capacitance adjustment circuitry may together be viewed as a digital varactor circuit that provides varying amount of capacitance on or between one or more output terminals in response to a changing digital input.

Having introduced the invention by way of the embodiments described above, a more detailed description is now presented of a preferred embodiment of the invention shown in the context of a phase locked loop. Many of the specific details, frequencies, bit-widths, register sizes, etc. are given by way of example and are not to be interpreted as limiting the invention. One of ordinary skill in the art will recognize many additional ways of implementing the invention based upon the teaching of this disclosure.

Figure 7:
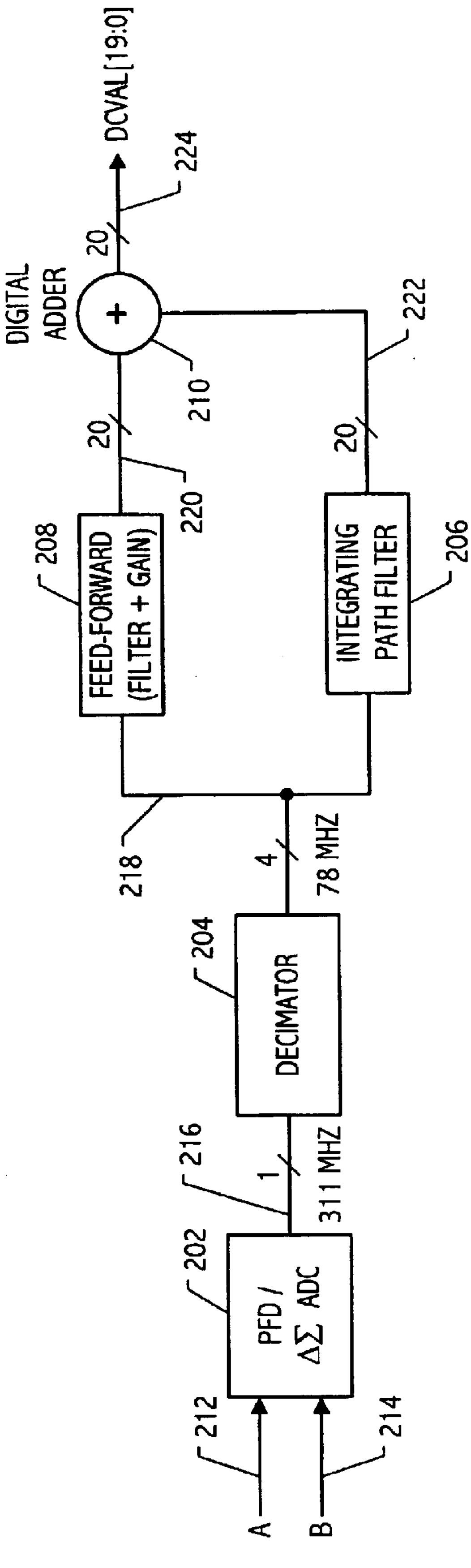
FIG. 7 is a block diagram representing an embodiment of a portion of a digital loop filter for a PLL.

Referring now to FIG. 7, a portion of a PLL is shown which primarily includes a loop filter for the PLL. Also shown is a phase detector 202 which compares phase or phase/frequency between two signals A and B conveyed respectively on nodes 212 and 214 and generates accordingly an error signal on output node 216. The phase detector circuit 202 preferably includes a linear phase detection circuit followed by a delta-sigma modulator to generate a 1-bit digital bit-stream error signal. For this example, the phase detector circuit 202 may be assumed to produce a 311 MHz 1-bit wide error signal 216. Preferred digital phase detector circuits are described in the above-referenced U.S. patent application Ser. No. 09/902,542 by Perrott, and also in the above-referenced co-pending U.S. Patent Application entitled "Method and Apparatus for Switching Between Input Clocks in a Phase-Locked Loop" by Huang, et. al.

The error signal 216 is received by a decimator circuit 204 that produces a lower frequency, wider bit-width error signal on its output node 218, which is then conveyed to both a digital feed-forward block 208 and a digital integrating path filter 206. In the example depicted, the decimated error signal is a 4-bit wide 78 MHz signal which is preferably calculated by adding each of several weighted sequential data bits in the input bit stream. For example, four sequential data bits may be each weighted by a factor of two and added to produce an unsigned output having a range from 0000 to 1000. In a preferred embodiment each 4-bit value of the decimated error signal may be calculated by adding: a first data bit weighted by a factor of one; the next three data bits each weighted by a factor of two; and a fifth data bit weighted by a factor of one. This technique simultaneously provides decimation, gain, and digital low-pass filtering.

Figure 8:
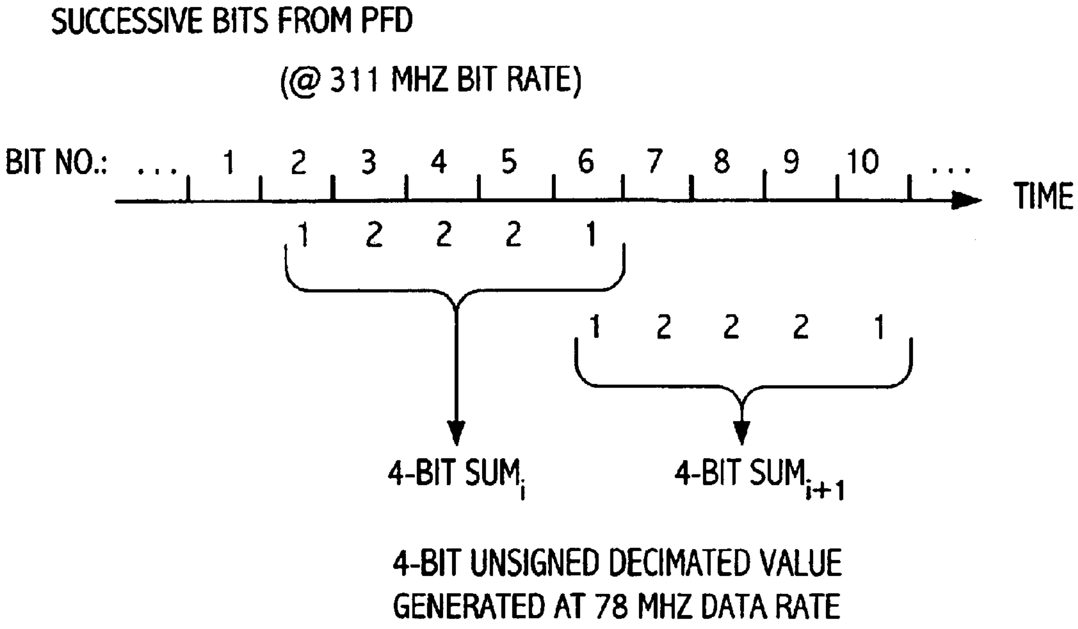
FIG. 8 is a diagram representing preferred operation of a circuit block depicted in FIG. 7.

Such a calculation is shown in FIG. 8, which depicts successive data bits of the error signal to the decimator circuit 204. A four-bit value SUM[3:0] is calculated by adding: BIT[2] weighted by a factor of one; BIT[3] weighted by a factor of two; BIT[4] weighted by a factor of two; BIT[5] weighted by a factor of two; and BIT[6] weighted by a factor of one. The next four-bit value SUM [i+1] is calculated by adding: BIT[6] and BIT[10], each weighted by a factor of one; and BIT[7], BIT[8], and BIT[9] after each is weighted by a factor of two. Consequently, the overall gain of this block is two (i.e., in aggregate each bit is weighted by a factor of two) and the overlapping summation technique results in a filtering effect. With an overall gain of two, and since a calculation is performed for every four sequential input data bits, the calculated output values may range from 0000 to 1000. This unsigned value is preferably converted to a signed value ranging from 1100 (−4) through 0000 (0) to 0100 (+4), although such conversion may be performed in the decimator circuit 204 or in the succeeding circuit stages. Alternatively, such succeeding stages may be designed to directly operate using an unsigned input value, without an explicit conversion to a signed value. In the descriptions herein, the decimator circuit 204 may be considered to be part of the PLL loop filter, but a similar decimation circuit or function may alternatively be considered to be part of a more complex phase detector circuit 202.

Referring again to FIG. 7, the decimator circuit 204 produces a 4-bit wide error signal at a 78 MHz data rate on its output node 218, which is then conveyed to both a feed-forward block 208 and an integrating path filter 206. The feed-forward block 208 and integrating path filter 206 are preferably both digital circuits that generate output values such as 20-bit values, as shown, although it is understood that other circuits and other output widths may be employed as well. The respective outputs 220 and 222 of these blocks are added by digital adder 210 to preferably produce on output node 224 a 20-bit digital control signal DCVAL[19:0] for the VCO. The integrating path filter 206 preferably incorporates digital signal processing circuitry and/or digital signal processing techniques as described generally in the above-referenced U.S. patent application Ser. No. 09/902,541 by Perrott, et al., and as more specifically described herein. For some embodiments, the function depicted by the digital adder 210 may be incorporated into a subsequent circuit block which receives both output signals 220 and 222.

Referring now to FIG. 9, a preferred embodiment of a digital loop filter 230 is depicted. The 4-bit decimated error signal 218 is conveyed to a digital accumulator circuit 232 which sums the 4-bit decimated error signal 218 and accumulates up to a 46-bit result. The particular bit position of the digital accumulator circuit 232 into which the 4-bit decimated error signal 218 is added is configurable in accordance with a selected bandwidth and peaking setting for the PLL transfer function, as indicated in FIG. 10. For example, for a selected bandwidth of 12.5 Hz and peaking of 0.05 dB (i.e., the top line in the chart), the 4-bit decimated error signal DEC_ERR[3:0] conveyed on node 218 is added at bit positions LPF_ACCUM[3:0] of the low pass filter accumulator (indicated by the “I I I I” characters), and a 46-bit result is accumulated on bits LPF_ACCUM[45:0]. Alternatively, for a selected bandwidth of 6400 Hz/0.05 dB, the 4-bit decimated error signal DEC_ERR[3:0] is added at bit positions LPF_ACCUM[21:18], and a 28-bit result is accumulated on bits LPF_ACCUM[45:18], with the lower 18 bit positions LPF_ACCUM[17:0] being ignored.

Irrespective of the bandwidth and peaking selected, the low-pass filter digital output signal conveyed on node 222 is preferably an upper portion of the accumulator, such as the upper 20-bits of the accumulator, namely LPF_ACCUM [45:26] for this example. As shown in FIG. 9, this output signal may be a 20-bit unsigned data word, although internally the upper 20 bits of the accumulator may preferably be signed bits. The feed-forward filter 208 preferably has a gain of 4 and consequently has an output that is preferably a signed 6-bit data word. Referring again to FIG. 10, the particular bit position of the 20-bit integrator path output signal 222 into which the 6-bit feed-forward filter output signal is added, is also configurable in accordance with a selected bandwidth and peaking setting for the PLL transfer function. For convenience, these 6-bits are mapped into appropriate bit positions of a 20-bit output signal 220 (with sign extension), and the two 20-bit signals 220 and 222 are added by digital adder circuit 210 to generate on node 224 (i.e., in this case, bus 224) a 20-bit VCO control signal DCVAL[19:0]. For example, for a selected bandwidth of 12.5 Hz and peaking of 0.05 dB (i.e., the top line in the chart), the 6-bit feed-forward filter output signal is mapped into bit positions [5:0] of the 20-bit output signal conveyed on node 220 as indicated by the “F F F F F F” characters. It should be noted that the “F F F F F F” position determines the PLL’s bandwidth while the “I I I I” position and the “F F F F F F” position together determine the PLL’s peaking.

An extremely long low pass filter time constant may be achieved in the digital accumulator circuit 232 by calculating up to an internal 46-bit result, but not all of these bits must necessarily be conveyed to subsequent circuits, such as the VCO control signal generation circuit, especially if such succeeding circuits cannot make use of the 46-bit resolution. In the exemplary embodiment shown, the output value of the low pass filter may be taken from only the upper 20-bits of the accumulator and represented herein also as LPF[19:0]. However, in certain embodiments, some additional precision may be maintained beyond just the upper 20-bit value by conveying a group of the next lower accumulator bits to a sigma-delta modulator circuit 234 that generates, for example, a 1-bit serial data bit stream representative of those bits, and adding the resulting 1-bit serial output bit stream to the upper 20-bits to generate another 20-bit result. Any given value of the DCVAL[19:0] signal will, of course, have only 20-bits of resolution, but a large group of sequential values of the DCVAL[19:0] signal will generate an average value which is representative of 32-bits of resolution, not just 20-bits, even though only 20-bits are conveyed to subsequent circuit blocks.

Figure 9A:
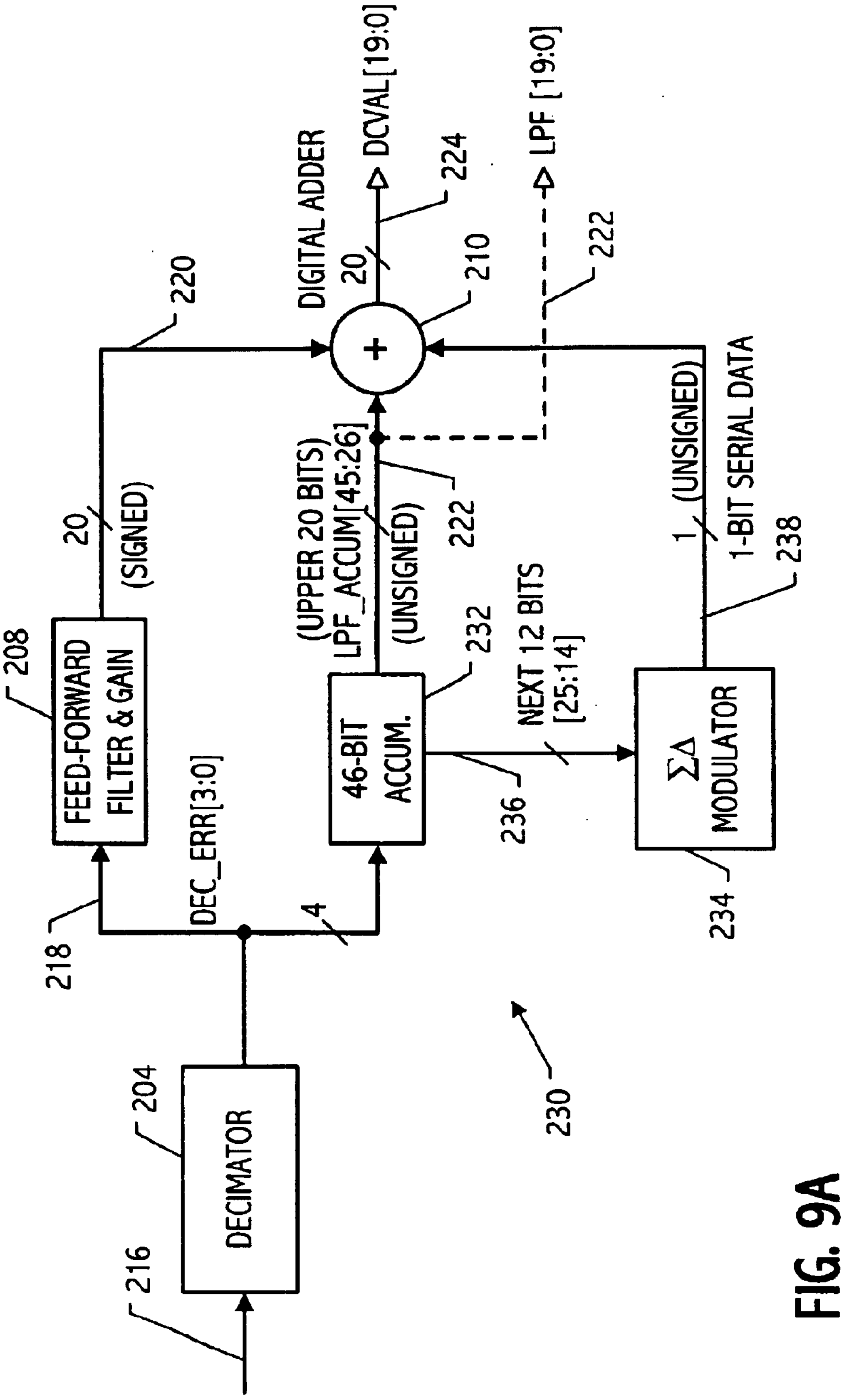
FIG. 9A is a block diagram representing a preferred embodiment of a digital loop filter for a PLL.
Figure 10:
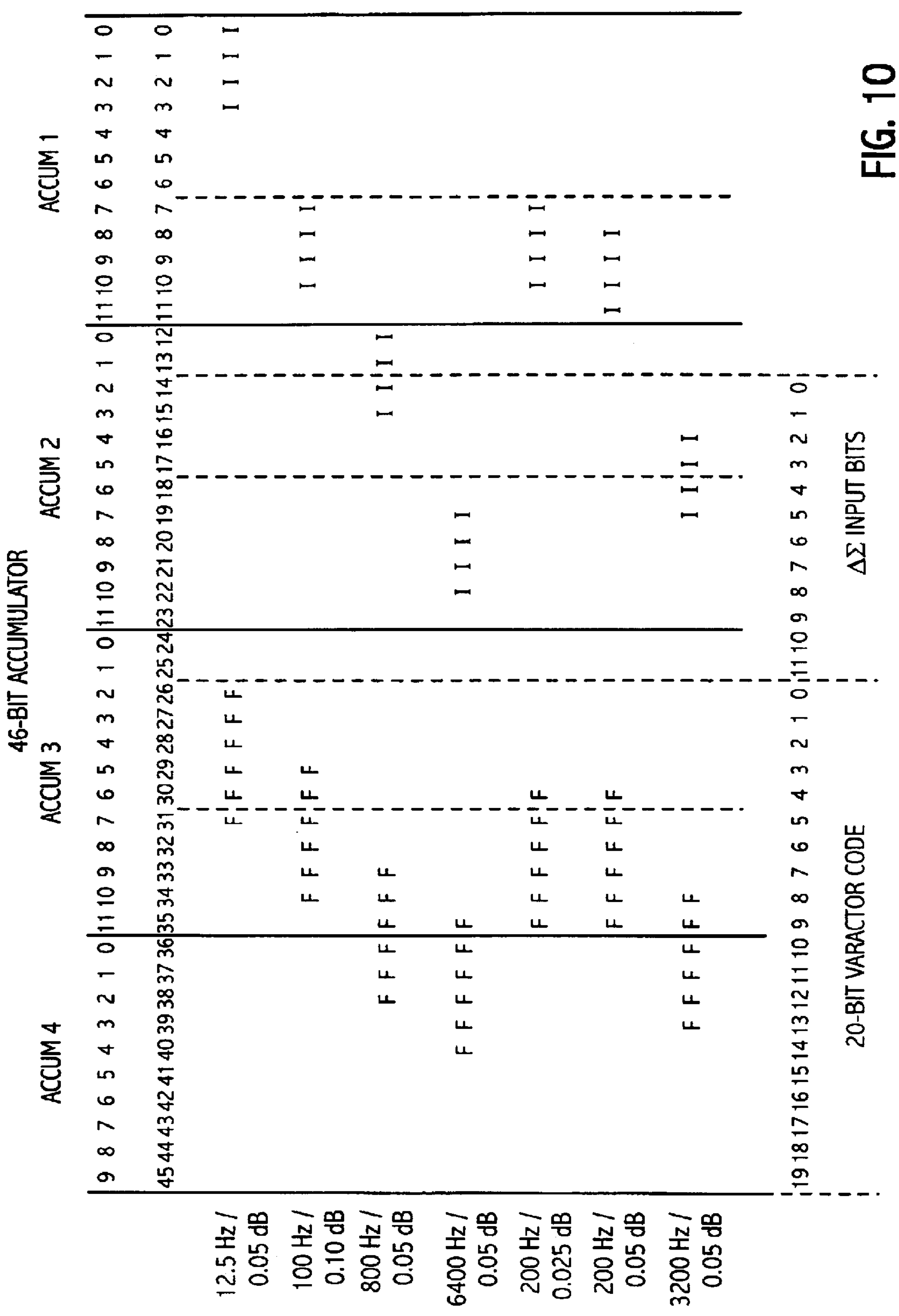
FIG. 10 is a diagram representing preferred operation of circuit blocks depicted in FIG. 9A and FIG. 9B.

As depicted in FIG. 9A, the digital adder 210 may include a third input to receive this one-bit sigma-delta modulated signal 238 and add its value to the two 20-bit values also communicated to the adder 210. For certain embodiments described below, the low pass filter output signal LPF[19:0] may also be communicated to succeeding circuit blocks, as shown by a dotted line. The digital accumulator circuit 232 may alternatively include both the sigma-delta modulator function (shown here as a separate circuit block 234) and an adder function. For example, the upper 20-bits of the accumulator may be added to the one-bit sigma-delta modulated signal in an adder circuit separate from the accumulator, and a single 20-bit result communicated to the digital adder circuit 210.

Figure 9B:
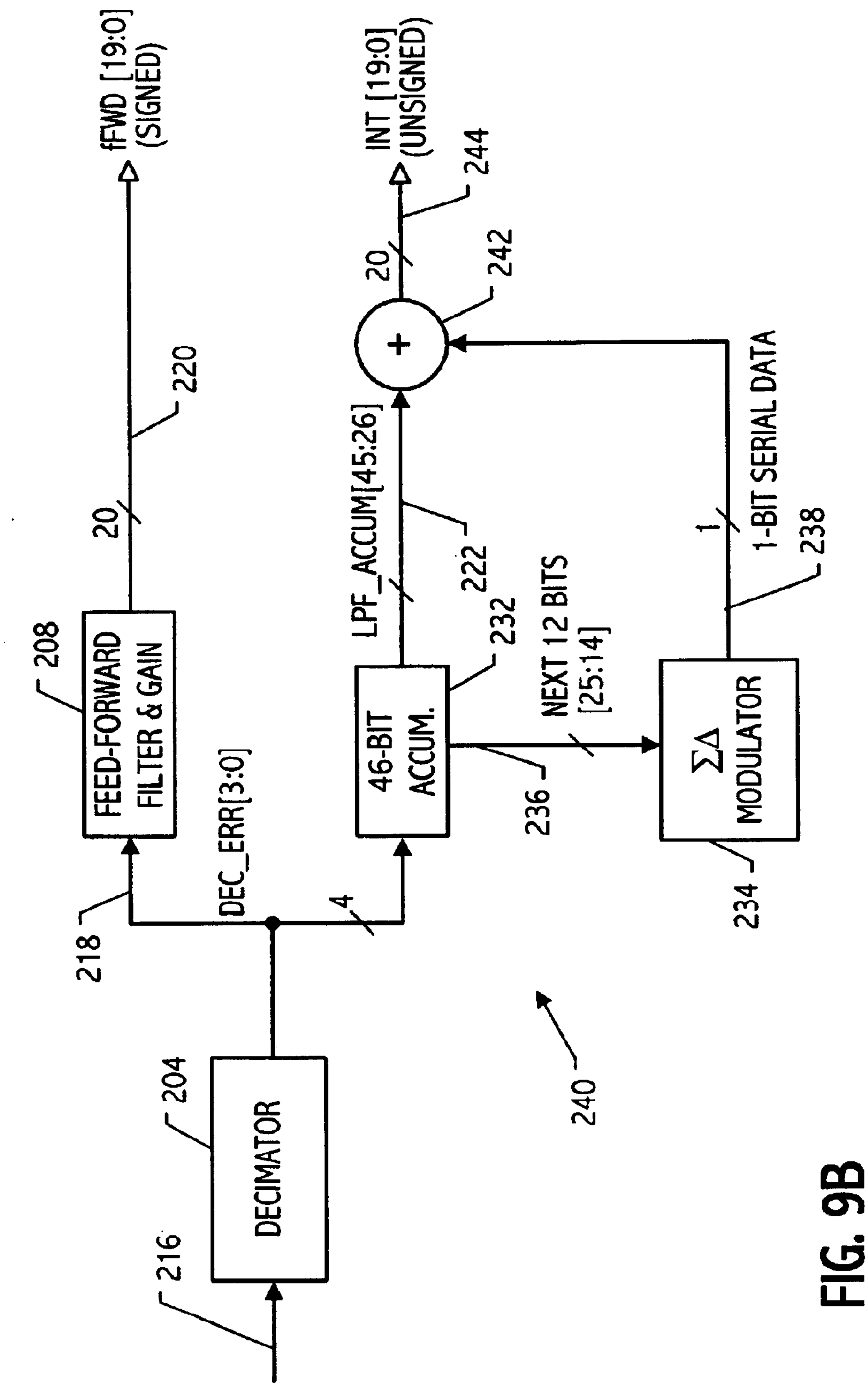
FIG. 9B is a block diagram representing a preferred embodiment of a digital loop filter for a PLL.

In yet another preferred embodiment depicted in FIG. 9B, the upper portion (e.g., upper 20-bits) of the accumulator are added to the one-bit sigma-delta modulated signal representative of a next lower portion (e.g., the next 12 bits) of the accumulator by the digital adder circuit 210, and a single integrator path output signal labeled int[19:0] (e.g., a 20-bit result) is communicated on node 223 to the subsequent circuit. The output of the feed forward path fFwd[19:0] is also conveyed directly to the subsequent circuit and is added therein to generate the varactor control word value.

Such sigma-delta modulator circuits are well known in the art. A preferred embodiment may be implemented utilizing a 12-bit accumulator whose carry output becomes the sigma-delta modulated output (e.g., the 1-bit signal that is conveyed to the digital adder 210). The 12 input bits of the sigma-delta modulator are added to the remaining bits of the 12-bit accumulator to determine its next state and the next output bit. Other variations of such sigma-delta modulators may also be implemented to encode additional bits of significance into a smaller number of bits, at least when averaged over multiple values.

Sigma-delta modulator circuits are well known in the art of digital-to-analog and analog-to-digital conversion techniques. In the embodiment shown the sigma-delta modulator block 234 is a digital-to-digital converter that is similar to such sigma-delta DACs but without an output analog filter. It should also be appreciated that using a number of bits other than the upper 20-bits for the basic low pass signal, and using a number of bits other than the next 12-bits for a sigma-delta "rounding circuit" may be advantageously chosen in other designs. The design of suitably wide accumulators, such as the 46-bit accumulator shown in FIG. 9, may be accomplished using any of a variety of well-known design techniques, for typically such a circuit need not operate at very high clock frequencies. As the chart of FIG. 10 implies, the 46-bit register may be implemented as a plurality of smaller registers, such as three 12-bit registers ACCUM1, ACCUM2, ACCUM3, and one 10-bit register ACCUM4.

Figure 11:
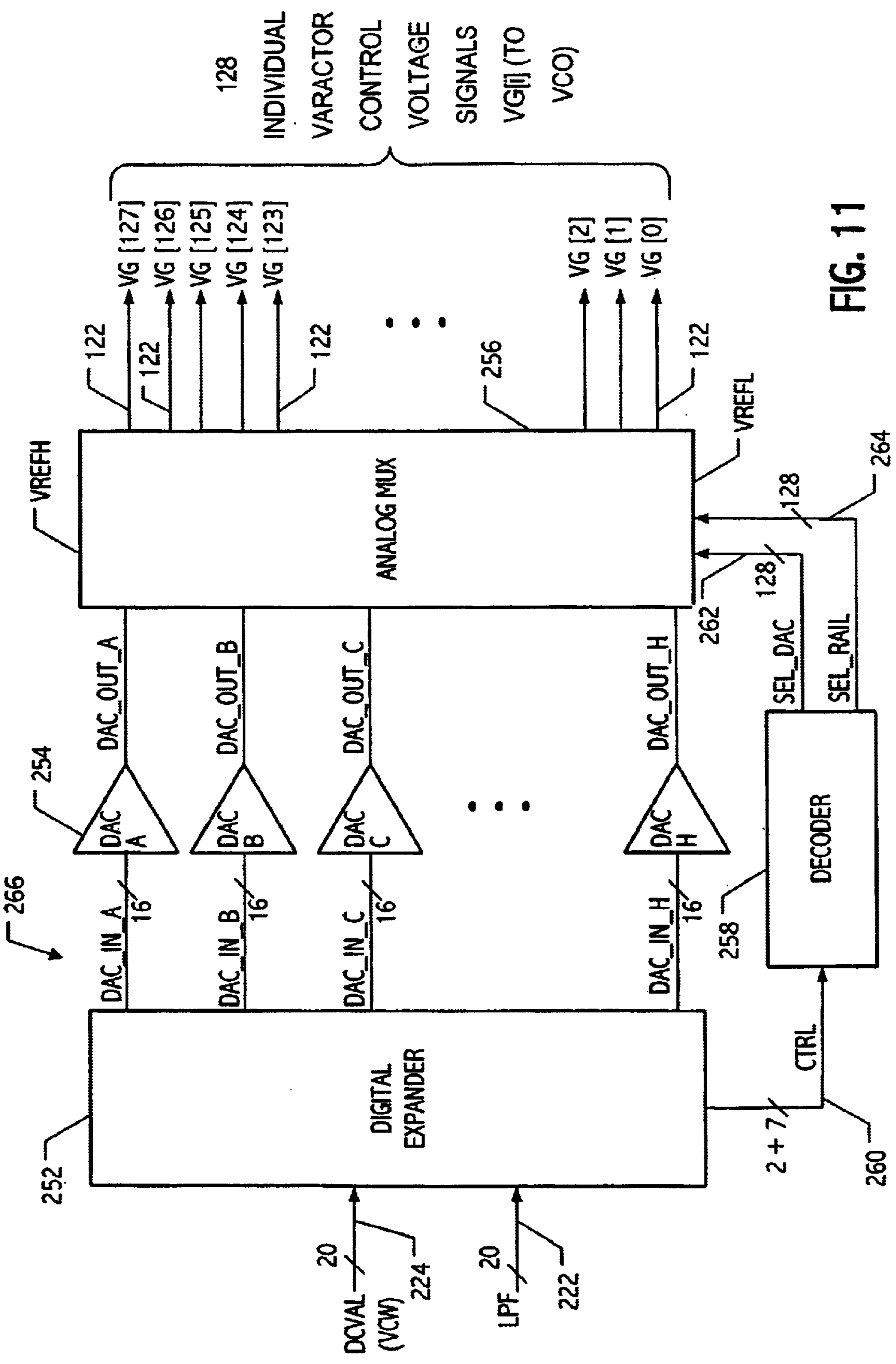
FIG. 11 is a block diagram of a control signal generation circuit useful for the circuit shown in FIG. 2.

A preferred embodiment of a VCO control signal generation circuit (such as the control signal generation circuit 126 shown in FIG. 2) is depicted in FIG. 11. This circuit utilizes only eight digital to analog converters 254 (individually labeled DacA, DacB, DacC, . . . DacH) and generates one-hundred twenty-eight (128) separate varactor control signals VG[0], VG[1], VG[2], . . . VG[127] for controlling the VCO. Generally eight of these control signals are each respectively driven by an associated one of the eight DACs 128, while the remaining one-hundred twenty (120) varactor control signals VG[i] are driven to either the high voltage reference level VREFH or the low voltage reference level VREFL by the multiplexer 256. A decoder circuit 258 receives various control signals CTRL 260 from the digital expander 252 to control which varactor control signal output nodes 122 are coupled by the multiplexer 256 to the output node of its associated DAC 128, which varactor control signal output nodes 122 are coupled to the high voltage reference level VREFH, and which varactor control signal output nodes 122 are coupled to the low voltage reference level VREFL. The decoder circuit 258 preferably generates a 128-bit fully-decoded SEL_DAC signal conveyed on bus 262 to indicate which of the eight varactor control signals VG[i] are to be coupled to associated DACs, and also preferably generates a 128-bit fully-decoded SEL_RAIL signal conveyed on bus 264 to indicate which of the two reference levels each of the remaining varactor control lines should be coupled to. Other decoder configurations need not utilize fully decoded signals.

In certain embodiments, the voltages generated by each of the eight DACs 254 may all have values between the high voltage reference level VREFH and the low voltage reference level VREFL (i.e., in the analog region of the voltage levels between the rail voltages). However, when the analog multiplexer 256 switches a specific varactor control line VG[i] from a DAC output to one of the rail voltages (or vice-versa) a smooth transition may not occur. In order to provide a more smooth transition, it may therefore be desirable to have only the "middle" four DACs 254 generate an output voltage between the system voltage rails. The two DACs 254 "above" the middle four DACs may then be provided with appropriate digital inputs that cause the DAC to generate a full scale analog output value that is equal to the high voltage reference level VREFH, so that, when the multiplexer 256 switches a varactor control signal output node 122, any noise created on the control line is reduced. Likewise, the two remaining DACs 254 (i.e., "below" the middle four DACs) may then be provided with appropriate digital inputs that generate a DAC output value that is equal to the low voltage reference level VREFL.

Consequently, the digital expander 252 and its associated decoder circuit 258 preferably are configured to ensure that, before switching a varactor control line presently coupled to one of the two reference levels to the output of a DAC, the particular DAC is first driven to the same reference level and given time to settle. Similarly, before switching a varactor control line from a DAC output to one of the two reference levels, the particular DAC output is first driven to the same reference level. In such a manner, a much smaller number of DACs may be employed to generate a large number of varactor control signals, and yet have each varactor control signal start at the low voltage reference level VREFL and then, for increasing values of the varactor control word, smoothly transition from the low voltage reference level VREFL, through the analog range between the reference levels, and rest at the high voltage reference level VREFH for the upper range of varactor control word values.

A preferred example may therefore utilize a digital expander 252 that provides digital output codes 266 that are offset from each other such that four consecutive DACs 254 will provide an output that falls within the full scale analog output range. The additional digital output codes 266 for the "top" two expander outputs and the "bottom" two expander outputs will typically set the top two digital to analog converters and the bottom two digital to analog converters at their respective maximum and minimum output levels. Moreover, if digital to analog converters that allow for full scale outputs are utilized, then the top two DACs 254 may generally be providing analog outputs at a voltage level that matches the high voltage rail and the bottom two DACs 254 may generally be providing analog outputs at a voltage that matches the low voltage rail. As will be described below, at certain times only one DAC generates a high voltage rail level while three DACs generate a low voltage rail level, while at other times three DACs generate a high voltage rail level while only one DAC generates a low voltage rail level. Other particular special cases and more detailed examples are described below.

As shown in FIG. 11, two digital output signals are received from the loop filter. The DCVAL signal represents the desired value of the VCO control signal (and is preferably an unsigned value where 000 . . . 00 represents a varactor Cmin, and where 111 . . . 11 represents a varactor Cmax), while the LPF signal is the integrator path component (sometimes referred to herein as the "low-pass filter" component) portion of the DCVAL signal. In this embodiment both are preferably 20-bit values. The digital expander 252 preferably segregates the lower 15-bits (i.e., the LSB segment) and the upper 5 bits (i.e., the MSB segment) from the 20-bit varactor digital input value DCVAL[19:0]. The digital expander 252 then preferably expands the LSB segment into a plurality (e.g., eight) of different 16-bit expanded digital values DAC_IN_A, DAC_IN_B, . . . DAC_IN_H on buses 266. Each of these expanded digital values on buses 266 are preferably uniformly offset from its adjacent value for at least the number of DAC values (e.g., in this example, four) that represent analog output values between the minimum and maximum analog voltage levels (e.g., VREFL and VREFH). Preferably one of the expanded digital values DAC_IN_X corresponds to the LSB segment value, and more preferably is equal to the LSB segment value. The eight 16-bit expanded digital values DAC_IN_A, DAC_IN_B, . . . DAC_IN_H are then provided to eight respective DACs 254 (also labeled as DacA, DacB, . . . DacH) which provide corresponding analog outputs signals DAC_OUT_A, DAC_OUT_B, . . . DAC_OUT_H that are conveyed to the analog multiplexer circuit 256. As further described below, each digital to analog converter 254 preferably includes a hybrid second-order/first-order sigma-delta modulator and a second order low-pass RC filter as described below, although other configurations may be advantageously employed.

In the embodiment depicted, the digital values provided to each of the eight DACs254 are computed using the digital output DCVAL received on bus 224 from the loop filter, but the determination of which eight varactor control signals VG[i] are driven by the eight DACs 254 is preferably based upon the low pass filter signal LPF[19:0] received on bus 222 from the loop filter (also variously referred to as the "integrator path" signal INT[19:0]) rather than upon the complete DCVAL signal (which, of course, includes the value of the LPF signal). Additional details of an exemplary operation is provided below by way of a detailed description of a preferred embodiment.

Figure 12:
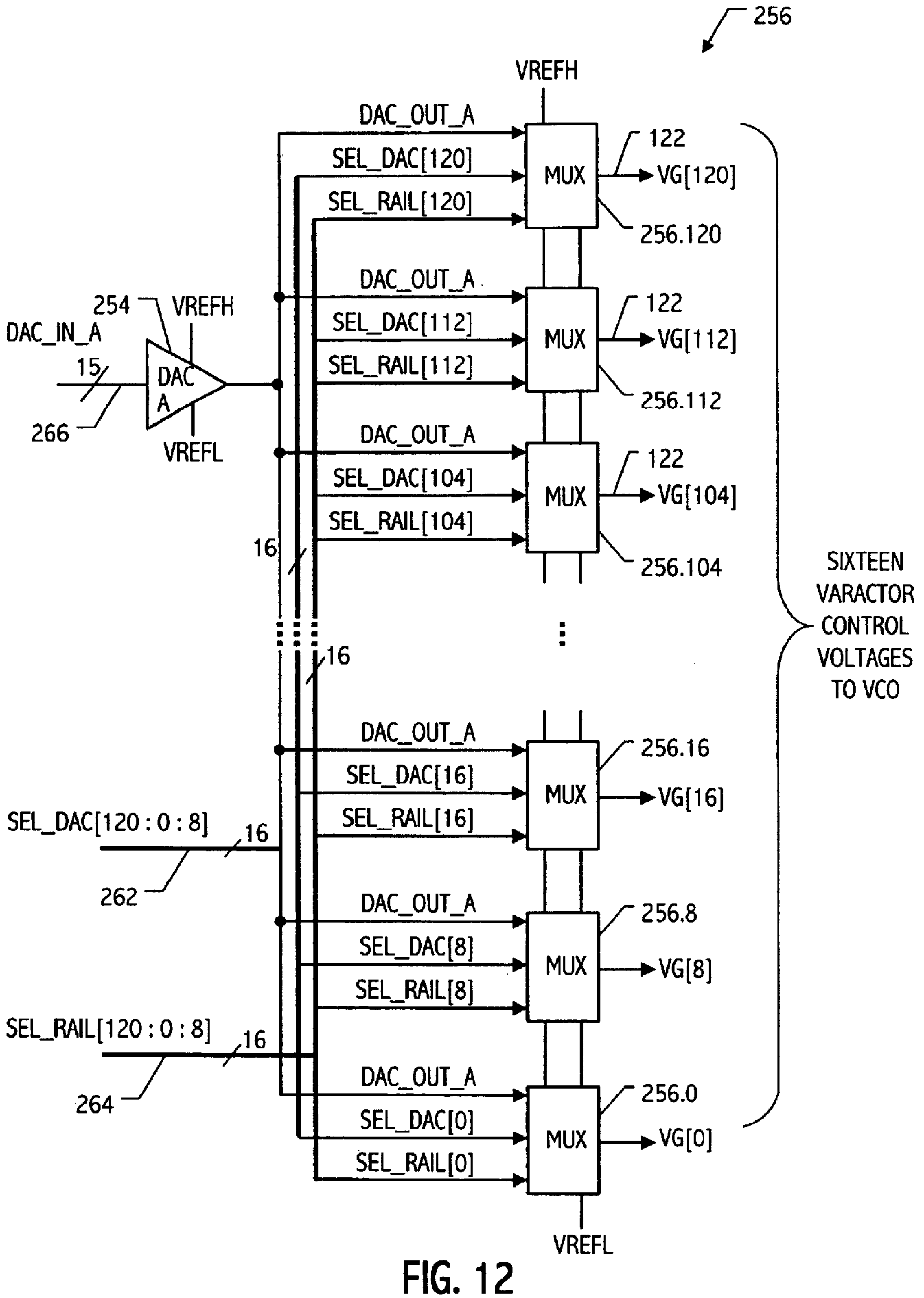
FIG. 12 is a block diagram of a portion of the control signal generation circuit shown in FIG. 11.

Referring now to FIG. 12, a portion of the multiplexer 256 is shown which corresponds to sixteen of the varactor control signals VG[i], along with their associated one of the eight DACs 254. The digital to analog converter DacA receives the 16-bit expanded digital value DAC_IN_A and generates a corresponding analog output voltage DAC_OUT_A which can be selected by the multiplexer 256 to drive one of these associated sixteen varactor control signals VG[0], VG[8], VG[16], . . . VG[104], VG[112], VG[120]. The multiplexer 256 receives a select DAC signal SEL_DAC to indicate which varactor control signal should be coupled to the DacA output signal. For example, if SEL_DAC[8] is active (e.g., a logic "one"), the corresponding VG[8] is coupled to the DacA output signal DAC_OUT_A by sub-multiplexer 256.8. Only one of the sixteen SEL_DAC signals associated with a given DAC is driven active, and the remaining fifteen SEL_DAC signals are held inactive (e.g., at logic 0). For the fifteen non-selected varactor control signals, the corresponding SEL_RAIL signal determines whether to drive the varactor control signal to the high rail or the low rail (i.e., VREFH or VREFL). In a preferred embodiment, multiplexer 256 includes three transfer gates (or "pass" gates), each for coupling the VREFH signal, the associated DAC output, and the VREFL signal, respectively, to the control signal output. A decoder receives the two control signals and enables the appropriate pass gate. While the transfer gate coupling the DAC output to the control signal output is a full CMOS transfer gate (i.e., includes both N-channel and P-channel transistors), the other two transfer gates need only be half-transfer gates (i.e., including only a P-channel or N-channel transistor which is appropriate to convey the particular reference voltage).

As can be inferred from this figure, the other seven DACs are arranged similarly. For example, the digital to analog converter DacB receives the 15-bit expanded digital value DAC_IN_B and generates a corresponding analog output voltage DAC_OUT_B which can be selected to drive one of its associated sixteen varactor control signals VG[1], VG[9], VG[17], . . . VG[121]. DacC can be selected to drive one of its associated sixteen varactor control signals VG[2], VG[10], VG[18], . . . VG[122]; DacD can be selected to drive one of its associated sixteen varactor control signals VG[3], VG[11], VG[19], . . . VG[123]; DacE can be selected to drive one of its associated sixteen varactor control signals VG[4], VG[12], VG[20], . . . VG[124]; DacF can be selected to drive one of its associated sixteen varactor control signals VG[5], VG[13],VG[21], . . . VG[125]; DacG can be selected to drive one of its associated sixteen varactor control signals VG[6], VG[14], VG[22], . . . VG[126]; and DacH can be selected to drive one of its associated sixteen varactor control signals VG[7], VG[15], VG[23], . . . VG[127].

As can be readily discerned from this arrangement, any eight adjacent varactor control signals may be coupled to the eight DACs and the remaining varactor control signals driven either to the upper or lower reference levels. For example, the lower eight varactor control signals VG[0], VG[1], VG[2], . . . VG[7] may be driven respectively by DacA, DacB, DacC, . . . DacH. For a different digital value of DCVAL[19:0] and LPF[19:0], the eight varactor control signals VG[2], VG[3], VG[4], . . . VG[9] may be driven respectively by DacC, DacD, DacE, . . . DacB. Referring now to FIG. 13, an example data pattern of the two decoded select signals SEL_DAC and SEL_RAIL are shown to more fully illustrate the exemplary operation of these selection signals. In the circumstances depicted in FIG. 13, only seven DACs are coupled to a varactor control signal output (i.e., SEL_DAC[24] through SEL_DAC[30] are high). All the varactor control signals below the group of seven DAC-driven varactor control signals are driven high by the multiplexer 256 (i.e., SEL_RAIL[0] through SEL_RAIL[23] are high) and all the varactor control signals above the group of seven DAC-driven varactor control signals are driven low by the multiplexer 256 (i.e., SEL_RAIL[31] through SEL_RAIL[127] are all low). The seven signals SEL_RAIL[24] through SEL_RAIL[30] are shown as a high, but are preferably ignored by the multiplexer 256 because these varactor control signals are coupled to the DACs.

In this example data pattern the eighth DAC is not selected because it is transitioning from one end of the selected group of varactor control signals to the other end to follow a changing varactor control value from the loop filter. As stated above, VG[23] and VG[31] are both associated with DacH. For a given value of the varactor control value, the varactor control signal VG[23] is driven by DacH and the group of eight selected varactor control signals driven by DACs might be VG[30:23]. If the digital varactor control value increases, DacH is rolled-over to drive VG[31] and the group of eight selected varactor control signals driven by DACs might be VG[31:24]. To accomplish this roll-over, DacH is first unselected from VG[23] and then the DAC_IN_H is driven from a digital value corresponding to a full-scale high level to a digital value corresponding to a full-scale low level. Until the output signal of DacH has settled, it is not coupled to VG[31], resulting in only seven DACs actively selected for a time. This is the situation represented in FIG. 13. It is equally representative of a decreasing varactor control value, during a rollover transition of DacH from VG[31] to VG[23] but before the DacH is coupled to VG[23].

Figure 14:
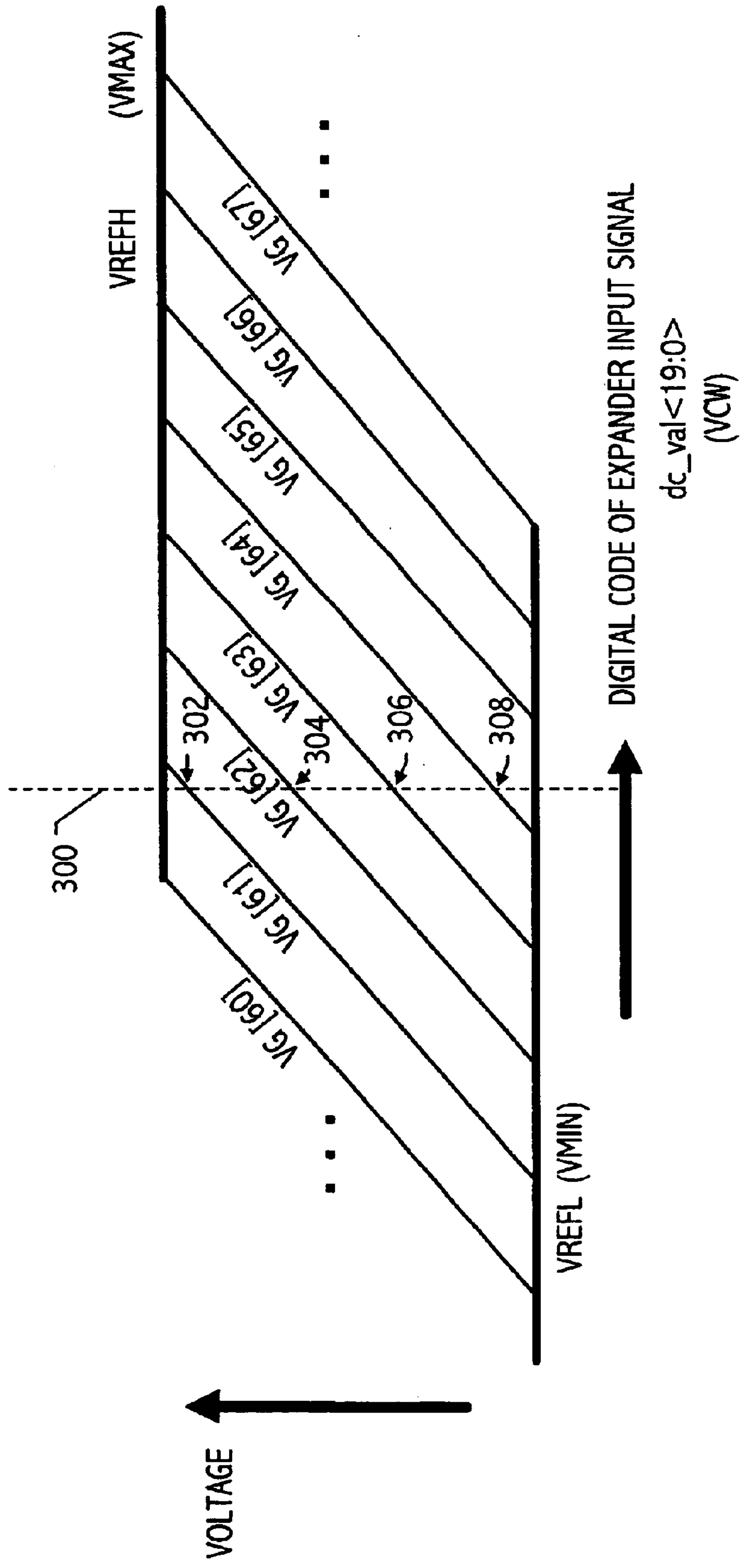
FIG. 14 is a diagram illustrating useful behavior of the multiple control signals for the circuit shown in FIG. 11.

FIG. 14 illustrates the values of eight varactor control signals VG[67:60] over a small range of varactor control value DC_VAL[19:0] received from the loop filter. In this example no more than four varactor control signals have a value between the high voltage reference level VREFH and the low voltage reference level VREFL. For example, for an input digital value corresponding to the dotted line labeled 300, all the varactor control signals from VG[0] through VG[60] are all at the VREFH level, the VG[61] signal has an intermediate value indicated by point 302, the VG[62] signal has a smaller intermediate value indicated by point 304, the VG[63] signal has an even smaller intermediate value indicated by point 306, and the VG[64] signal has a yet even smaller intermediate value indicated by point 308. The remaining varactor control signals from VG[65] through VG[127] are all at the VREFL level.

An exemplary implementation of the digital expander 252 and decoder circuit 258 is described below in the context of their behavior. Various structures and configurations to achieve such behavior and/or equivalent behavior may be readily engineered based upon this description.

Figure 15:
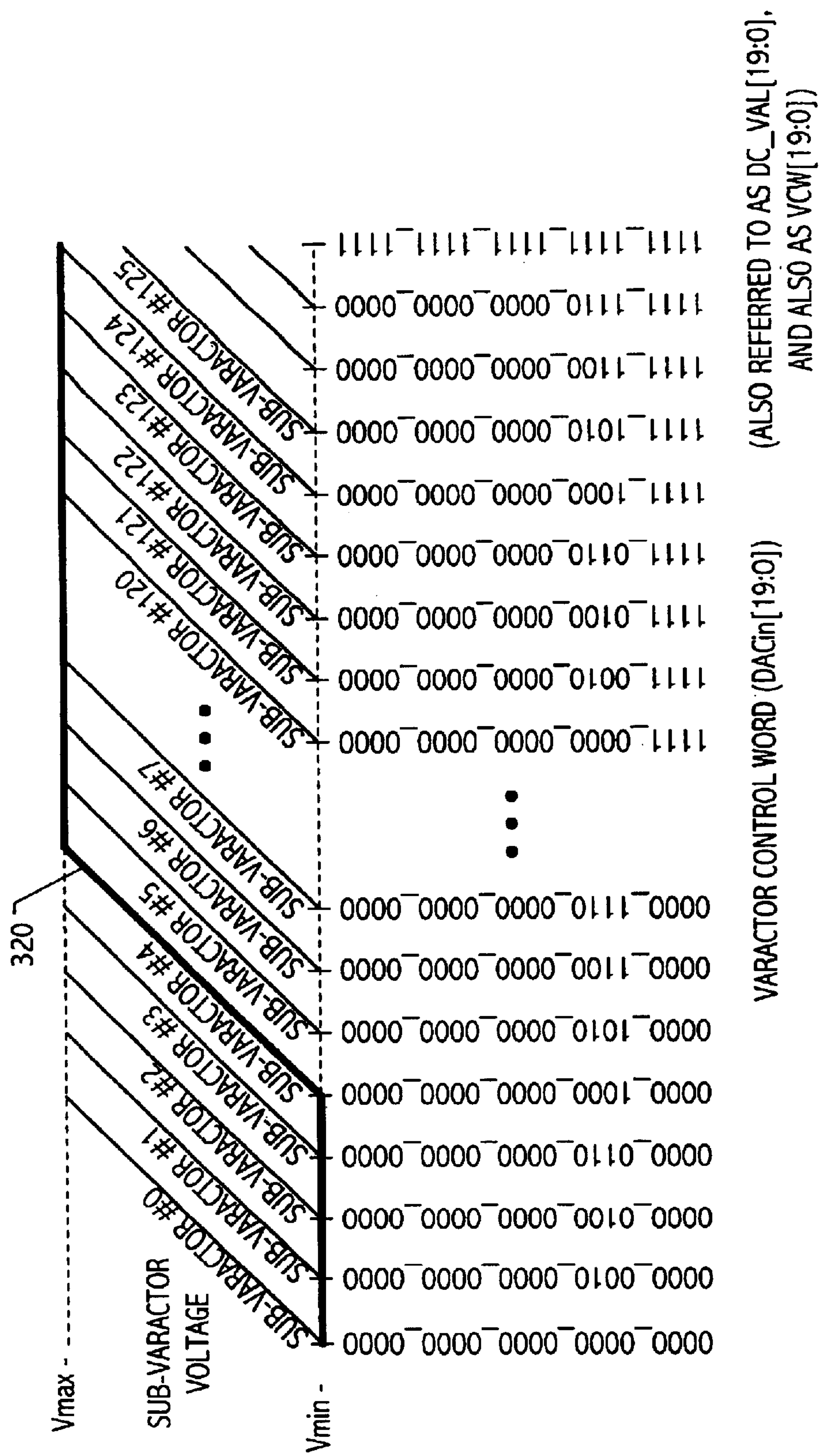
FIG. 15 is a diagram illustrating useful behavior of the multiple control signals for the circuit shown in FIG. 11.

The following several figures illustrate how the eight sub-DACs and the multiplexer may be controlled such that each of the 128 sub-varactors are driven properly and smoothly, without any voltage glitches that could cause increased VCO noise. Referring now to FIG. 15, a diagram is shown to illustrate preferable voltages that are applied to the 128 sub-varactors as a function of the 20-bit varactor control word, DC_VAL[19:0] which is also variously referred to as DACin[19:0]. For clarity, the voltage applied to sub-varactor #4 is highlighted (and labeled as 320). Note that for any value of the 20-bit varactor control word, at most 4 sub-varactors are in their active regions (i.e. have a voltage between Vmax and Vmin). All the other varactors are either at Vmax or at Vmin. The 5 MSBs of the varactor control word may be used to determine if a particular sub-varactor is active or not, and if a sub-varactor is active, only the 15 LSBs of the varactor control word need be used to determine its voltage value. Thus, at a minimum, only four 16-bit sub-DACs are needed to control the entire composite varactor. Depending on the value of the varactor control word, each of the 128 varactors will be connected to either the upper reference voltage VREFH (also labeled Vmax and which may be considered as a digital “1”), or to the lower reference voltage VREFL (also labeled Vmin and which may be considered as a digital “0”), or to one of these eight sub-DACs. As the earlier description has already introduced, the multiplexer is preferably controlled such that these eight sub-DACs are connected to the proper sub-varactors, and the eight sub-DACs controlled such that they provide the proper voltage, all according to the value of the varactor control word DC_VAL[19:0].

As the value of the varactor control word increases or decreases, a new sub-varactor is made active (while a previously active sub-varactor is made inactive). Doing this requires switching a sub-DAC from the previously active sub-varactor to the newly active sub-varactor, and requires changing the output value of the sub-DAC from one end of its range (Vmin or Vmax) to the other end of its range (Vmax or Vin). Therefore, care must be taken to prevent noise spikes from appearing at either the newly active or the previously active sub-varactor. This may be difficult to ensure with just four sub-DACs since there may not be enough settling time for a sub-DAC to make such a drastic change. Consequently, using more than the number of active sub-DACs (e.g., in this example, four) is preferred such that some amount of settling time can be given to allow the output level of the sub-DAC that is being switched to settle to its new value before connecting it to the new sub-varactor. A preferred embodiment using eight sub-DACs is described below which allows ample time for a sub-DACs analog output voltage to settle before connecting the sub-DAC to a different sub-varactor.

The 8 sub-DACs are numbered from A to H, as described above. The first sub-DAC, labeled DAC_A, may be used to drive sub-varactors with active ranges that begin at DC_VAL[15:13]=000. The DAC_B may then be used to drive sub-varactors with active ranges that begin at DC_VAL[15:13]=001. DAC_C may be used to drive sub-varactors with active ranges that begin at DC_VAL[15:13]=010. And so on, through the last sub-DAC, DAC_H, which may be used to drive sub-varactors with active ranges that begin at DC_VAL[15:13]=111.

In a preferred embodiment, the digital expander 252 and decoder circuit 258 (from FIG. 11) may be designed to utilize several variables for describing the configuration of the sub-DACs. For example, the firstDAC variable may be used to keep track of which sub-DAC is ‘first’. In other words, of the eight sub-DACs connected to associated varactor control signals when viewed as in FIG. 15, which of the eight sub-DACs is connected to the left-most (i.e., lowest-numbered) of such varactor control signals. The firstDACaddr variable may be used to keep track of the address of the sub-varactor driven by the first sub-DAC. These seven most significant bits of the DC_VAL[19:0] varactor control word essentially sub-divide the entire range of the varactor control word into 128 identifiable portions, corresponding to each of the 128 sub-varactors. The dacPosA, dacPosB, . . . dacPosH variables may be used to keep track of the relative positions of the sub-DACs. The dacStateA, dacStateB, . . . dacStateH variables may be used to keep track of the operational conditions of the eight sub-DACs. The state variable is used to indicate if a sub-DAC is being “rolled” or switched and, if so, the direction of the switch. Lastly, the dacValA, dacValB, . . . dacValH are the output values for the sub-DACs (also variously described herein as DAC_IN_A, DAC_IN_B, etc.). The meaning and purpose of these variables will become clear through the following examples and accompanying description.

The following several figures illustrate an example of rolling a particular sub-DAC (in this example, DAC_C) from a lower to a higher sub-varactor, which generally would occur as the value of the varactor control word DC_VAL increases. Referring now to FIG. 16, an arbitrary sub-DAC configuration is illustrated along with the corresponding values for the several inputs (e.g., the integrator path value INT[19:0], the feed forward value FFWD[19:0], and the resultant varactor control word DCVAL[19:0]) and the internal variables introduced above.

In the embodiment shown, the voltage generated on each of the 128 sub-varactor output nodes (i.e., sub-varactor control signals) is a function of the varactor control word DC_VAL[19:0], which is computed by summing the feed forward path FFWD with the integrator path (i.e., low pass filter) control word INT[19:0], as described above. However, the positions of the sub-DACs are preferably controlled by using just the value of the integrator path, INT[19:0]. This allows the varactors to be driven by respective voltages which are appropriate for the varactor control word, but reduces unnecessary rolling of DACs which might otherwise occur as a result of wide swings in the value of the feed forward signal.

Since the eight sub-DACs are coupled to drive a group of eight adjacent sub-varactor control signals, and generally only four sub-DACs are driven to an intermediate voltage, a nominal configuration of the sub-DACs, for a given range of varactor control word values, provides two sub-varactor control signals "below" the four active sub-varactor control signals, which two sub-varactor control signals are already coupled to and driven by sub-DACs to the upper reference voltage Vmax. All the varactor control signals below these two are also driven to the same upper reference voltage Vmax by the multiplexer 256. Similarly, there are also two sub-varactor control signals "above" the four active sub-varactor control signals, which two sub-varactor control signals are already coupled to and driven by sub-DACs to the lower reference voltage Vmin. All the varactor control signals above these two are also driven to the same lower reference voltage Vmin by the multiplexer 256. It should be appreciated that such directionality notation is arbitrary and could be equally well reversed.

Referring specifically to FIG. 16, for values of the varactor control word DACin[19:0] equal to 1011__111X__XXXX__XXXX (i.e., between 1011__1110__0000__0000 and 1011__0000__0000__ 0000), which is a region labeled 350, the four sub-DACs that are driven to intermediate voltages are DAC__E, DAC__F. DAC__G, and DAC__H. DAC__C and DAC__D are driven to the upper reference level Vmax, while DAC__A and DAC__B are driven to the lower reference level Vmin. Consequently, this particular connection of the eight sub-DACs to eight particular adjacent sub-varactor control signals (shown as darkened lines) will properly generate the varactor control signals even if the varactor control word DACin[19:0] decrease below 1011__1110__0000__0000. In particular, the varactor control word can decrease all the way to 1011__1010__0000__0000 (labeled 352) before this particular connection of the eight sub-DACs cannot generate the proper sub-varactor control signals, because there is no sub-DAC connected to sub-varactor control signal 354. Similarly, the varactor control word can increase all the way to 1100__0100__0000__0000 (labeled 356) before this particular connection of the eight sub-DACs cannot generate the proper sub-varactor control signals, because sub-DAC__C is not yet connected to sub-varactor control signal 358.

It is desirable to allow the varactor control word to excursion at least somewhat outside the range of 1011__111X__XXXX__XXXX because it might quickly excursion back within this range. However, it would be difficult to allow such an extreme range of varactor control word values (described just above) before rolling the sub-DACs if a predictable amount of settling time is to be afforded when switching a sub-DAC. As a result, in preferred embodiments, such as those described here, the decision to "roll" the DACs is made as a function of the integrator path only, and a threshold value is used which is closer to the range 350 than either value 352 or 356. Preferably, a "transition high-to-low" (THL) threshold (labeled 360) is defined at a value which is 50% into the next higher one of the 128 separate address spaces determined by the seven MSBs of INT[19:0]. When the integrator path value INT[19:0] first crosses this THL threshold value, the sub-DAC__C will be 'rolled' from the sub-varactor control signal 364 to the sub-varactor control signal 358. The value of the varactor control word (e.g., DACin[19:0]) may previously have exceeded the THL threshold, but the sub-DACs are preferably only rolled when the integrator path value (e.g., INT[19:0]) first exceeds the THL threshold. This value of the THL threshold is preferably chosen, for this embodiment, because the feed-forward path can only increment the DACin[19:13] value at most by +/−1 LSB shown in FIG. 16. For example, if the INT[19:0] value corresponds to that labeled 360, the highest possible DACin[19:13] value will correspond to location 368, which still affords some margin before the next control signal 358 would be required.

In a similar fashion, a "transition low-to-high" TLH threshold (labeled 362) is defined at a value which is within, preferably by 50%, the next lower one of the 128 separate address spaces determined by the seven MSBs of INT[19:0]. Other choices are, of course, also possible to provide the timing margins described here. When the integrator path value INT[19:0] first crosses this TLH threshold value, the sub-DAC__B will be 'rolled' from the sub-varactor control signal 366 to the sub-varactor control signal 354. Even though the value of the varactor control word may previously have crossed below the TLH threshold, the sub-DACs are preferably only rolled when the integrator path value first crosses below the TLH threshold.

The example depicted by the next several figures illustrates rolling the lowest sub-DAC__C from the varactor control signal 364 up to the next-higher varactor control signal 358 when the value of the integrator path value crosses above the THL threshold. The THL threshold is assumed to be 1100__0001__0000__0000__0000 (i.e., 50% into the next address space), and the integrator path value has changed from a previous value of 1100__0000__0100__0110__1100, which is less than the THL threshold, to a current value of 1100__0001__0010__1100__0100, which is slightly greater than the THL threshold.

Also, note that in this exemplary situation, the value of FFWD[19:0] is assumed to be at its most-positive allowable value, which results in the greatest difference between the integrator path value and the varactor control word value, and specifically results in the most positive varactor control word value for a given integrator path value. The varactor control word value is equal to 1100__0011__0010__1100__0100 (shown as an open arrowhead, labeled 368) which already far exceeds the THL threshold.

The respective values for the variables described above are indicated in the figure. The firstDAC variable has a value of 010 (taken from firstDACaddr[2:0]) indicating that the DAC__C is the first sub-DAC. The firstDACaddr variable has a value of 1011__010 (e.g., computed by subtracting "5" from INT[19:13]) which indicates which varactor control signal is connected to the first sub-DAC. The state variable has a value of 00, indicating that no DAC is currently transitioning (i.e., rolling) as of this clock cycle (before the current integrator path value is recognized).

The various DAC position variables represent the offset for each sub-DAC relative the firstDACaddr variable. For example, adding the dacPosA value of 110 to the firstDACaddr value of 1011__010 generates a value to indicate which of the 128 address space portions the DAC__A is the lowest valued active sub-DAC. This value is also the address of the particular varactor control signal to which sub-DAC__A is coupled (e.g., VG[1011__010+110]=VG[1100__000]=VG[96]). Since the mapping of sub-DACs to control signals is predetermined, the DAC position variables may be easily computed using the lower order portion of the firstDACaddr variable.

As described above, the dacValA variable is preferably a 16-bit digital word communicated to the sub-DAC__A, which generates an analog output voltage corresponding to this digital input word. As further described below, the sub-DACs are preferably designed to generate an analog voltage having a full scale analog output range extending from the lower reference voltage VREFL (or Vmin) to the upper reference voltage VREFH (or Vmax) in accordance with a full scale range of the digital input word having a lower limit of 0000_0000_0000_0000 and an upper limit of 1000_0000_0000_0000. In other embodiments, of course, a different digital range may be chosen corresponding to the analog output range. For example, the upper limit may be 1111_1111_1111_1111, and thus fully utilize all 16 bits of information communicated to the sub-DACs. But it is advantageous to choose the full scale range having an upper limit of 1000_0000_0000_0000, for ease of sub-DAC design, as described further below.

As can be seen in FIG. 16 for the example shown, the digital value communicated to the sub-DAC_B (the variable dacValB) is taken directly from the lower 13 bits of the varactor control word (e.g., DACin[12:0]) and is equal to 0001_0010_1100_0100. The digital value communicated to each of the other three active sub-DACs is digitally offset from this value, by increments of 0010_0000_0000_0000 (which is one-quarter of the change in varactor control word value that causes a particular varactor control signal to swing "full scale" from its lowest level VREFL to its highest level VREFH). For example, the digital value communicated to the sub-DAC_A is equal to 0011_0010_1100_0100. The value of the dacValH variable (and thus the value of the digital control word communicated to the sub-DAC_H) is equal to 0101_0010_1100_0100, and the value of the dacValG variable is equal to 0111_0010_1100_0100.

In the above example, the lower 13 bits of each variable dacValB, dacValA, dacValH, and dacValG are preferably taken directly from the lower 13 bits of the varactor control word DACin[12:0]. The upper 3 bits of each variable (e.g., dacValB[15:13]) is preferably determined by the dacState variable, indicating which "fourth" of full scale operation each DAC is operating within. Alternatively, other mappings may be employed, such as using a fixed offset from the exemplary values just described, and such as non-uniform increments between adjacent sub-DACs.

Thus, four sub-DACs (sub-DAC_G, sub-DAC_H, sub-DAC_A, and sub-DAC_B) are driven to intermediate values. The other four (sub-DAC_C, sub-DAC_D, sub-DAC_E, and sub-DAC_F) are driven with a full scale digital control word (1000_0000_0000_0000) to generate a corresponding full scale analog output voltage equal to VREFH, as can be observed in figure.

Refering now to FIG. 17, the state of these variables are illustrated for the very next clock cycle as sub-DAC_C is switched from the first position to the last position (and its value is changed from VREFH to VREFL). It is shown with dotted line because it has NOT yet been connected to the corresponding sub-varactor control signal 358 (its output needs time to settle). The THL threshold (now labeled as 380) and the TLH threshold (now labeled as 382) have also shifted to the right (i.e., "shifted up") by one varactor control signal (i.e., 1/128 of the total range of the integrator path value).

As before, the THL threshold 380 is preferably defined at a value which is within, preferably by 50%, the next higher one of the 128 separate address spaces determined by the seven MSBs of INT[19:0]. Likewise, the TLH threshold 382 is preferably defined at a value which is within, also preferably by 50%, the next lower one of the 128 separate address spaces determined by the seven MSBs of INT[19:0].

A negative-most allowable value for FFWD[19:0] equal to 1111_1110_0000_0000_0000 is assumed in this figure to contrast FIG. 16 (even though such a swing in value may be unusual after only one additional clock cycle) which results in the most negative varactor control word value for the given integrator path value. Using such an extreme swing in value helps illustrate the ability of the preferred embodiment to resist unnecessary 'rolling' of the sub-DACs even in the presence of such large swings.

The example depicted shows the integrator path value has slightly increased from the previous value of 1100_0001_0010_1100_0100 to a current value of 1100_0001_1010_1000_0110, resulting in a varactor control word value DCVAL[19:0] of 1011_1111_1010_1000_0110 (shown as an open arrowhead, labeled 386). The analog output voltage of the sub-DAC_C is preferably not coupled to the varactor control signal 358 until the integrator path value exceeds a "not transitioning" (NT) threshold 384, which currently has a value of 1100_0010_0000_0000_0000. Since the current value of the integrator path is less than this, the sub-DAC_C remains unconnected, thus giving it time to transition from its old value of Vmax and settle at its new output value which is equal to Vmin.

The firstDACaddr[6:0] variable now has a value of 1011_011 which indicates which of the 128 varactor control signals is currently associated with (and if the first sub-DAC has settled in output voltage, connected to) the first sub-DAC. The firstDAC variable now has a value of 011 indicating that the DAC_D is the first sub-DAC. The state variable has a value of 11, indicating that a sub-DAC is transitioning (i.e., rolling) from high to low. The various DAC position variables have all shifted by one to reflect the change of the first DAC address.

The digital value communicated to the sub-DAC_A (the variable dacValA) is now set for a lowest possible value of 0000_0000_0000_0000, as are both the dacValB and dacValC variables. The dacValD variable is set to 1000_0000_0000_0000 to cause a full-scale output high level VREFH to be generated by the sub-DAC_D. The remaining four sub-DACs are driven to intermediate values each related to the lower 13 bits of the varactor control word DACin[12:0] by an integral number times the offset amount described above of 0010_0000_0000_0000 (which is one-quarter of the full-scale range of the sub-DACs). As shown, the digital value communicated to the sub-DAC_E is equal to 0111_1010_1000_0110. The value of the dacValF variable (and thus the value of the digital control word communicated to the sub-DAC_F) is equal to 0101_1010_1000_0110, the value of the dacValG variable (and thus the value of the digital control word communicated to the sub-DAC_G) is equal to 0011_1010_1000_0110, and the value of the dacValH variable (and thus the value of the digital control word communicated to the sub-DAC_H) is equal to 0001_1010_1000_0110.

Thus, four different sub-DACs (sub-DAC_E, sub-DAC_F, sub-DAC_G, and sub-DAC_H) are driven to intermediate values. The other four (sub-DAC_D, sub-DAC_A, sub-DAC_B, and sub-DAC_C) are driven with a full scale digital control word (either 1000_0000_0000_0000 or 0000_0000_0000_0000) to generate a corresponding full scale analog output voltage equal to VREFH or VREFL, as depicted in the figure.

FIG. 18 illustrates the completion of the THL sub-DAC switching process. When the integrator path value INT [19:0] crosses above the NT threshold 380, the sub-DAC_C is connected to the corresponding sub-varactor control signal 358. In the exemplary PLL environment described, it takes at least a predictable minimum amount of time (i.e., number of internal clock cycles) for the integrator path value INT[19:0] to increase from generally the original THL threshold 360 (shown on FIG. 16) to the NT threshold 384. This amount of time affords a settling time for the sub-DAC just switched or rolled from one end of the eight DACs to the other, before being connected to the new sub-varactor control signal (and hence to the new sub-varactor varactor in the VCO). Using the specific numeric example shown, the integrator path value has to increase an additional 1/256 of its total full-scale range (50% of the address space between two adjacent varactor control signals) after triggering a switch, before the switched sub-DAC is connected to the new varactor control signal. Other choices may be advantageous in other embodiments, and other methods may be employed to ensure adequate settling time, such as detecting a specific time delay having passed before connecting a sub-DAC to a new control signal output.

The state variable has returned to 00, indicating that no sub-DACs are transitioning, while the firstDAC variable and the firstDACaddr variable have not changed from the last figure. Likewise, the various DAC position variables have also not changed. But in this figure we are assuming, for additional clarity, yet again a different value for the feed forward path value FFWD[19:0], which is shown as zero. Thus the varactor control word value is equal to the integrator path value, which is assumed to be equal to 1100_0010_0100_0011_0010.

Conversely, the DAC state variables (e.g., dacStateA, etc.) have changed relative to the previous figure because the value of the varactor control word has crossed an "address boundary" of the individual varactor control signals (i.e., the upper 7 bits of the varactor control word).

The process of switching a sub-DAC down to a lower sub-varactor is analogous, except that such a switch is triggered when the INT[19:0] value drops below the TLH threshold, and will not be extensively described herein. However, the firstDACaddr variable preferably assumes a new value as soon as a sub-DAC is rolled, even though the rolled sub-DAC may not yet have settled and may not yet be connected to its new control signal.

Figure 19:
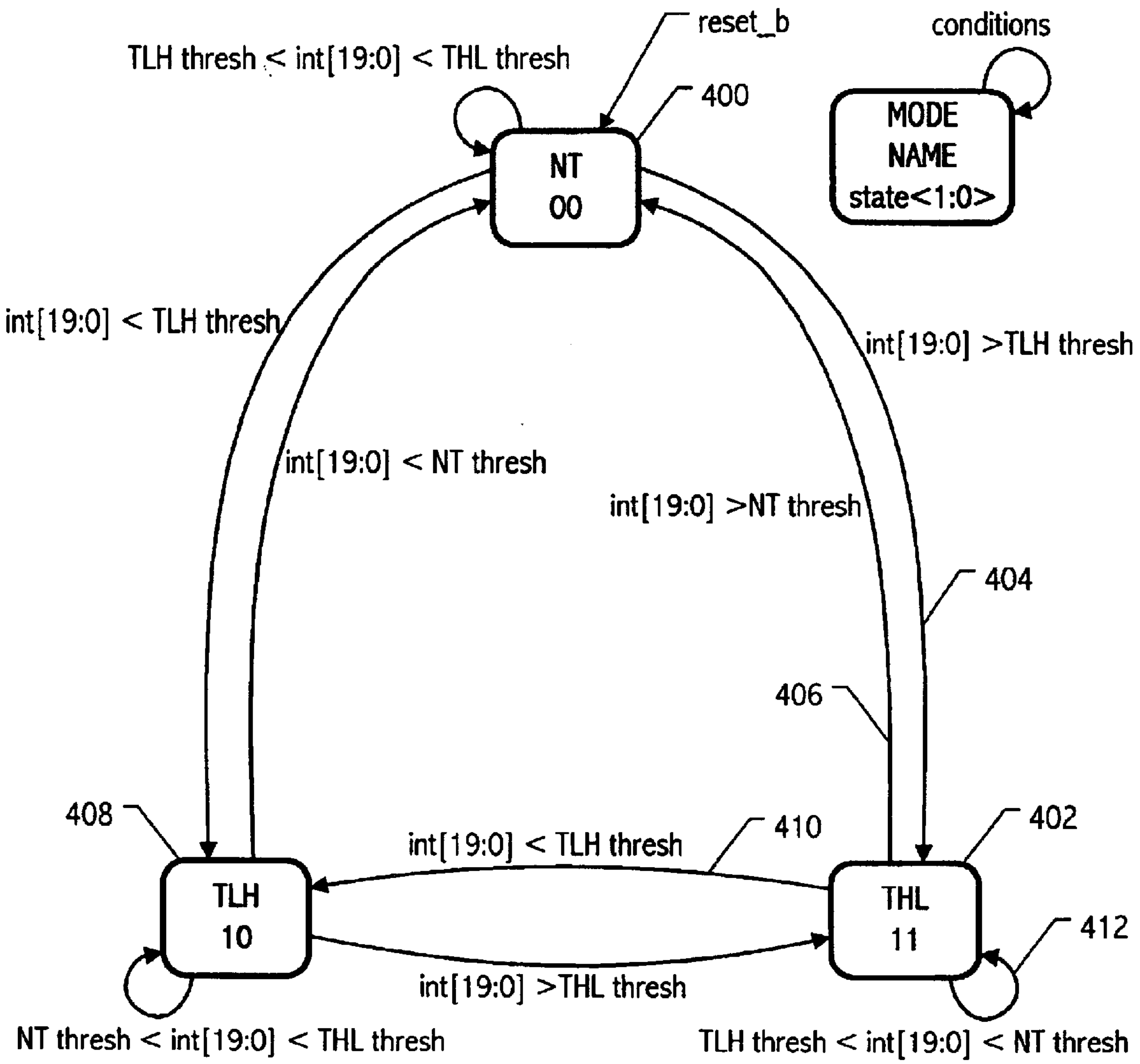
FIG. 19 is a state diagram illustrating useful behavior of the circuit depicted in FIG. 11 when the digital loop filter value changes.

Referring now to FIG. 19, a state diagram is shown to illustrate such a simple low-to-high transition, as well as other possible state changes. The high-to-low transition of a sub-DAC described in detail above is depicted as a transition from state 400 to state 402 by way of transition 404 which is initiated when the INT[19:0] increases above the THL threshold, idling (transition 412) while the INT[19:0] is less than the NT threshold, and then a transition 406 back to state 400 when the INT[19:0] exceeds the NT threshold.

Another possible state transition 410 occurs in the event that the INT[19:0] value fails to continue increasing (and never exceeds the NT threshold), but rather decreases far enough to dip below the TLH threshold. In this case the sub-DAC which was previously rolled "up" when state 402 was reached (but which was never connected to the new varactor control signal), is rolled back to its original configuration upon reaching state 408, and allowed to settle before being connected to the "original" varactor control signal when and if the INT[19:0] decreases below the new NT threshold.

Referring again briefly to FIG. 11, the control signals 260 communicated by the digital expander 252 to the decoder circuit 258 preferably include the 7-bit firstDACaddr variable and the 2-bit state variable. These values of these two variables provide sufficient information for determining all of the SEL_DAC and SEL_RAIL signals. The firstDACaddr value may be conveyed in gray code to reduce the number of simultaneously switching signal lines which may be routed near the VCO.

Figure 20:
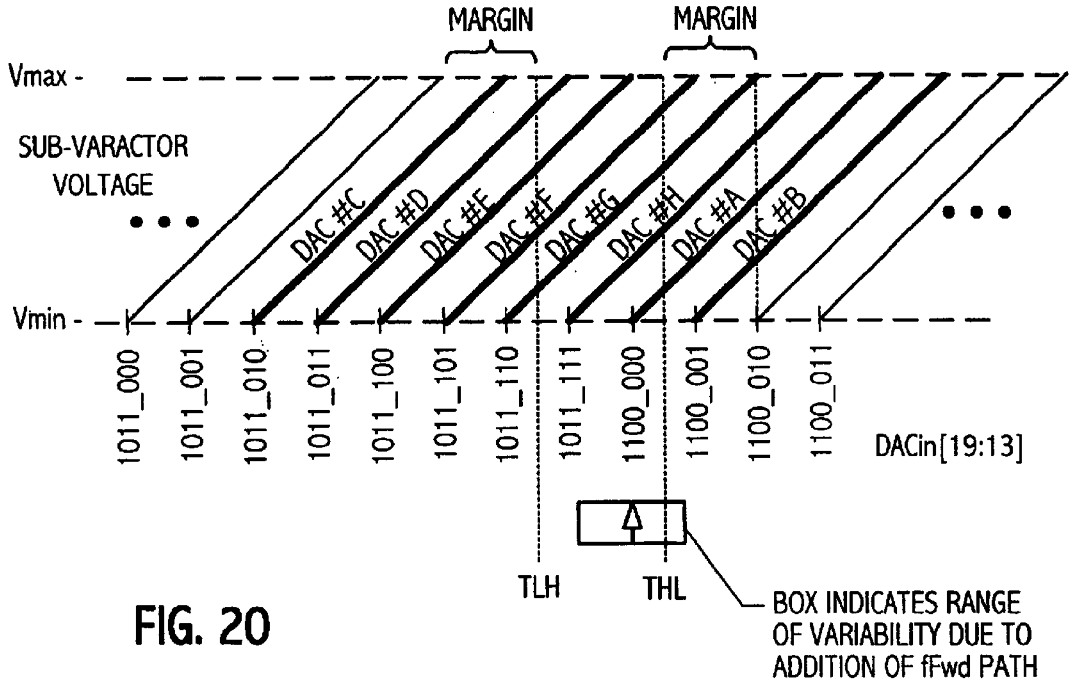
FIG. 20, FIG. 21, and FIG. 22 are additional diagrams illustrating, for the multiple DACs depicted in FIG. 11, exemplary operation of rolling a DAC in response to a sufficiently large change in the digital loop filter value.
Figure 21:
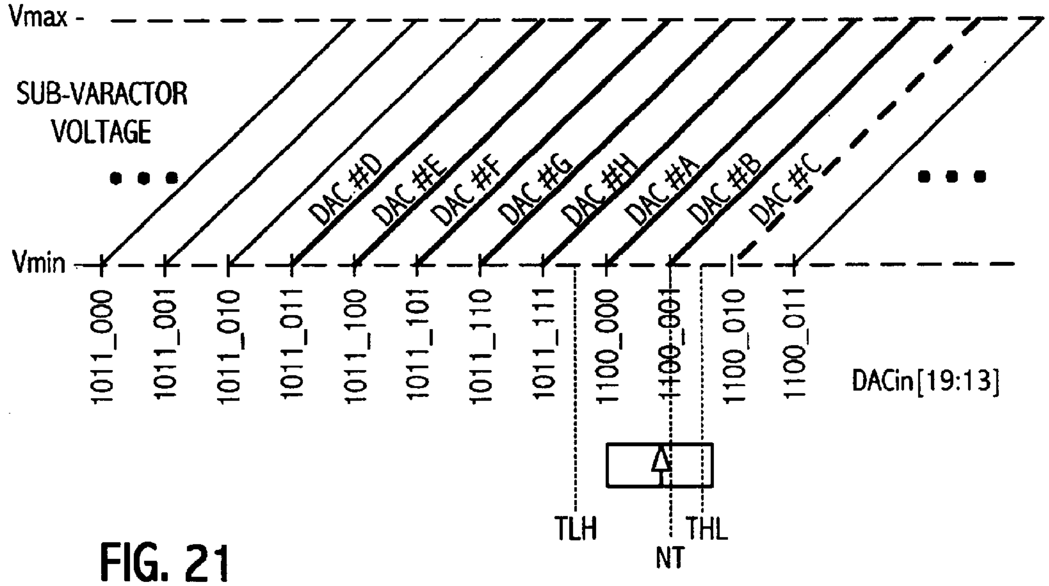
Figure 22:
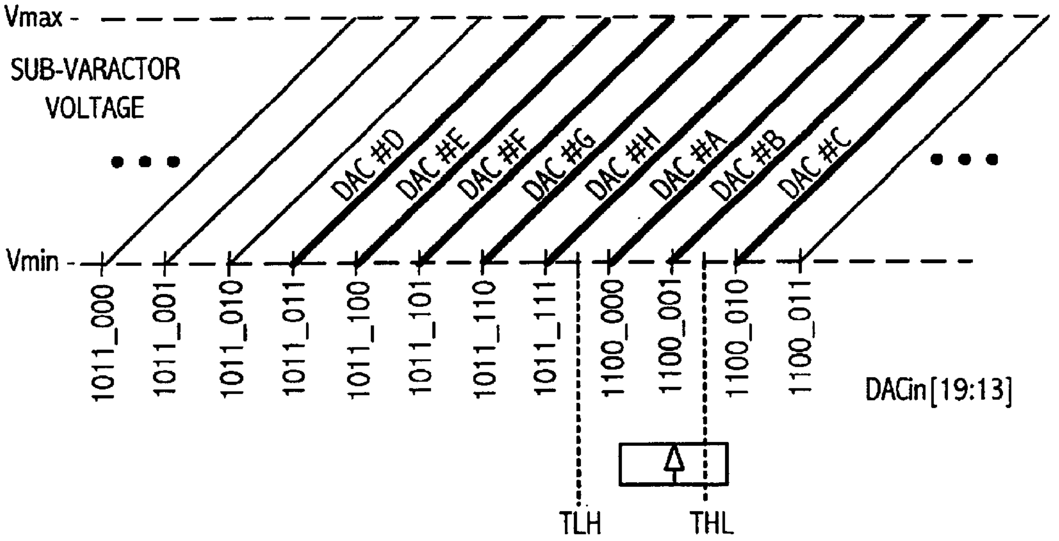

FIG. 20, FIG. 21, and FIG. 22 together depict an additional example of "rolling" a DAC from high to low, and visually illustrates (using a box) the possible range of DACin[19:0] values for a given integrator path value INT [19:0], without the more extreme fluctuations of the feed forward path signal depicted in the earlier figures.

In a preferred embodiment, such a digital varactor expander circuit may be synthesized rather than hand-designed. An exemplary coding (e.g., using well-known Verilog™ language) is shown in file "dacExpand.txt" of the above-referenced Computer Program Listing Appendix, which coding generally follows the block diagrams and description presented thus far. The code is well documented and believed to be instructive to one skilled in the art, particularly given the description presented herein. Nonetheless, as with any coded representation of a circuit function, many different synthesized implementations are possible, depending upon compiler options selected, the semiconductor technology selected, performance requirements, layout requirements, etc. Consequently, the exemplary code is believed to map as well upon many possible implementations of actual circuit structures and related methods, including implementations not necessarily similar or identical to the block diagrams shown.

Referring again to FIG. 5, the digital to analog converters 128 may be any of a wide range of digital to analog converters known in the art. In one preferred embodiment the digital to analog converters may include a delta-sigma modulator to accomplish the digital to analog conversion, followed by a linear filter circuit to smooth the analog output signal. (As used herein, 'sigma-delta' and 'delta-sigma' are used interchangeably.) In order to achieve a delta-sigma digital to analog conversion that provides full scale outputs at the voltage rail logic levels, a first order delta-sigma digital to analog converter may be utilized since most higher order delta-sigma converters do not reach the full scale without risk of instability. However, first order converters are prone to noise problems, particularly output tones. Thus, a more preferable digital to analog converter may include a hybrid first order/second order sigma-delta modulator circuit. In such a converter, the converter may operate essentially as a second order converter that degrades to a first order converter when its output approaches the positive and negative rails. Because the sub-varactor circuits are more sensitive to noise when the varactor control signals are within a middle portion of the full scale range between the rails than when near either rail, such a configuration affords the lower noise advantage of a second order sigma-delta modulator circuit. Such a second order sigma-delta modulator can have a lower over-sampling ratio and still achieve the same signal-to-noise ratio (e.g., quantization noise) as a first-order sigma-delta modulator. The sub-varactors may be driven through their active (e.g., high Kv) range without concern for first-order tones. When a sub-DAC output is near the rail, the same amount of noise on the control line VG[i] produces much less jitter due to the non-linearity of the sub-varactor C-V curve. By degrading to a first-order sigma-delta modulator when outside a middle portion of the range (e.g., at a voltage near either rail), such a configuration also allows glitchless switching from a full-rail sub-DAC output to either of the rails.

As used herein, a middle portion of a full scale range may, but need not, actually include the exact center or mid-point of the range, and may, but need not, be symmetrical about the mid-point, but rather such a "middle" portion is merely meant to not be co-extensive with either the full scale upper limit or lower limit of the full scale range, although preferably it may represent all but a few (or several) percent of the full scale range. In a preferred embodiment, the middle portion may include the center 30/32 of the full scale range, while in other preferred embodiments, the particular limits defining the middle portion may be configurable, such as by a single mask change, by a value written to a register, by laser programming, by electrically programming into a non-volatile memory cell, or by any other suitable technique.

Figure 23:
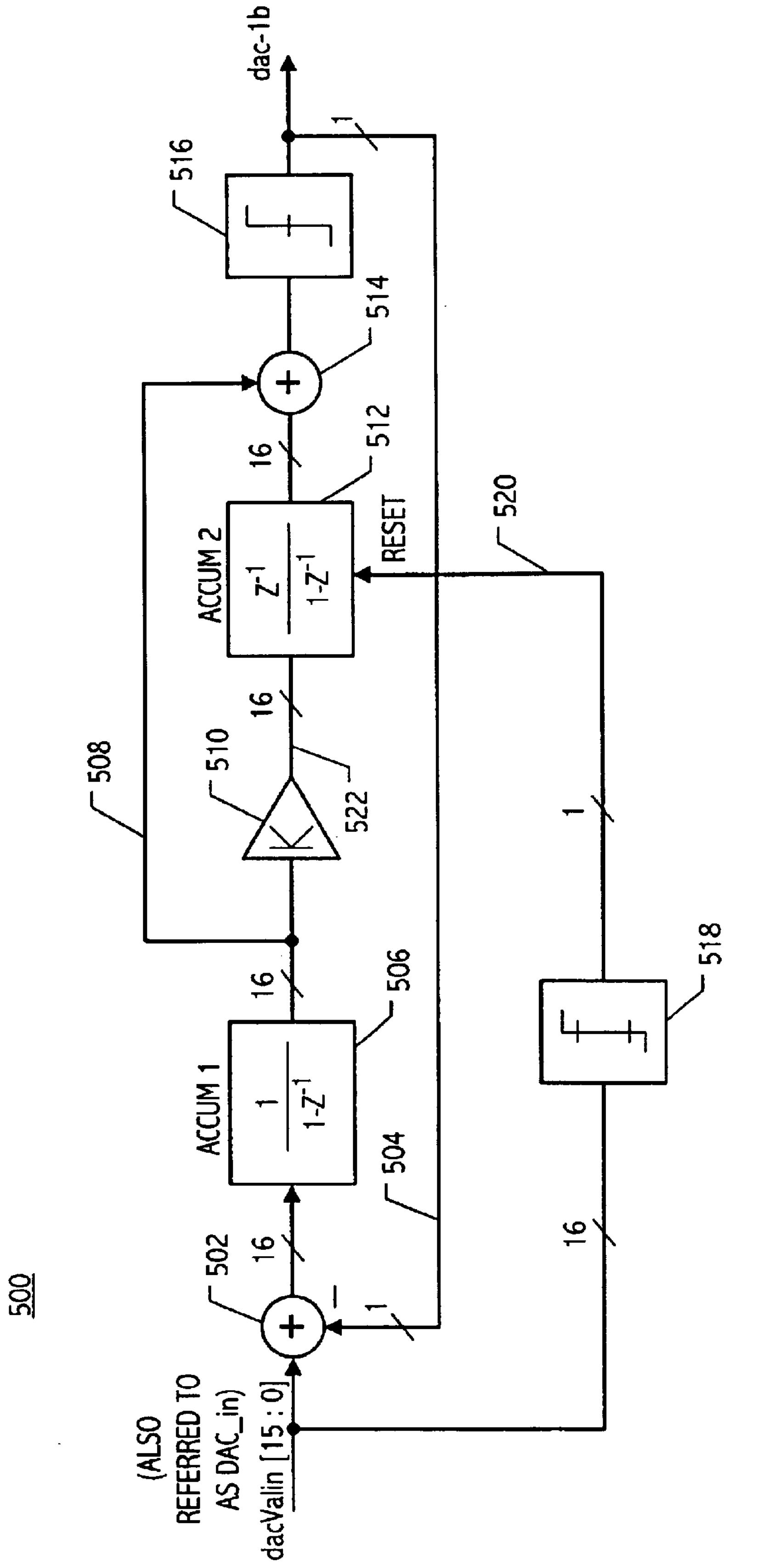
FIG. 23 is a block diagram of a hybrid first order/second order sigma-delta modulator circuit for use within a DAC such as those shown in FIG. 11.

A representation of a preferred embodiment of a hybrid first/second order sigma-delta modulator circuit is shown in FIG. 23. A first summing block 502 receives the digital input value dacVal[15:0] and adds the full scale reference value in accordance with the state of the output signal dac_1b, which is fed back on node 504 to summing block 502. The output of the summing block 502 is conveyed to a first accumulator 506, the output of which is conveyed through a gain stage 510 and then to a second accumulator 512. The output of the first accumulator 506, which is conveyed on bus 508, and the output of the second accumulator 512 are summed by a second summing block 514. A comparator 516 then generates an output signal based on whether this summation is greater than or less than zero (i.e., mid-value), which is conveyed back to the first summing block 502.

When operating as a second order sigma-delta modulator, the second accumulator 512 is allowed to accumulate a non-zero result in accordance with the input value conveyed on its input bus 522, and to communicate this accumulated result to the second summing block 514. However, whenever the digital input value communicated to the sigma-delta modulator dacVal[15:0] is close to either end of the full scale range of the digital input value (i.e., which corresponds to a desired analog output voltage falling close to either the high or low voltage rails), then the dual comparator 518 generates a reset signal to the second accumulator 512 which forces its outputs to remain at zero. Consequently, the second summing block 514 adds zero to the first accumulator 506 output value and the second accumulator 512 is essentially rendered inoperative, thus degrading the sigma-delta modulator to operate as a first order sigma-delta modulator. The second accumulator should not be allowed to over-flow or underflow as this causes errors. It should be appreciated that any indications of register widths and data path widths are merely illustrative of a particular embodiment and are not to be taken as limiting the invention in any way.

Figure 24:
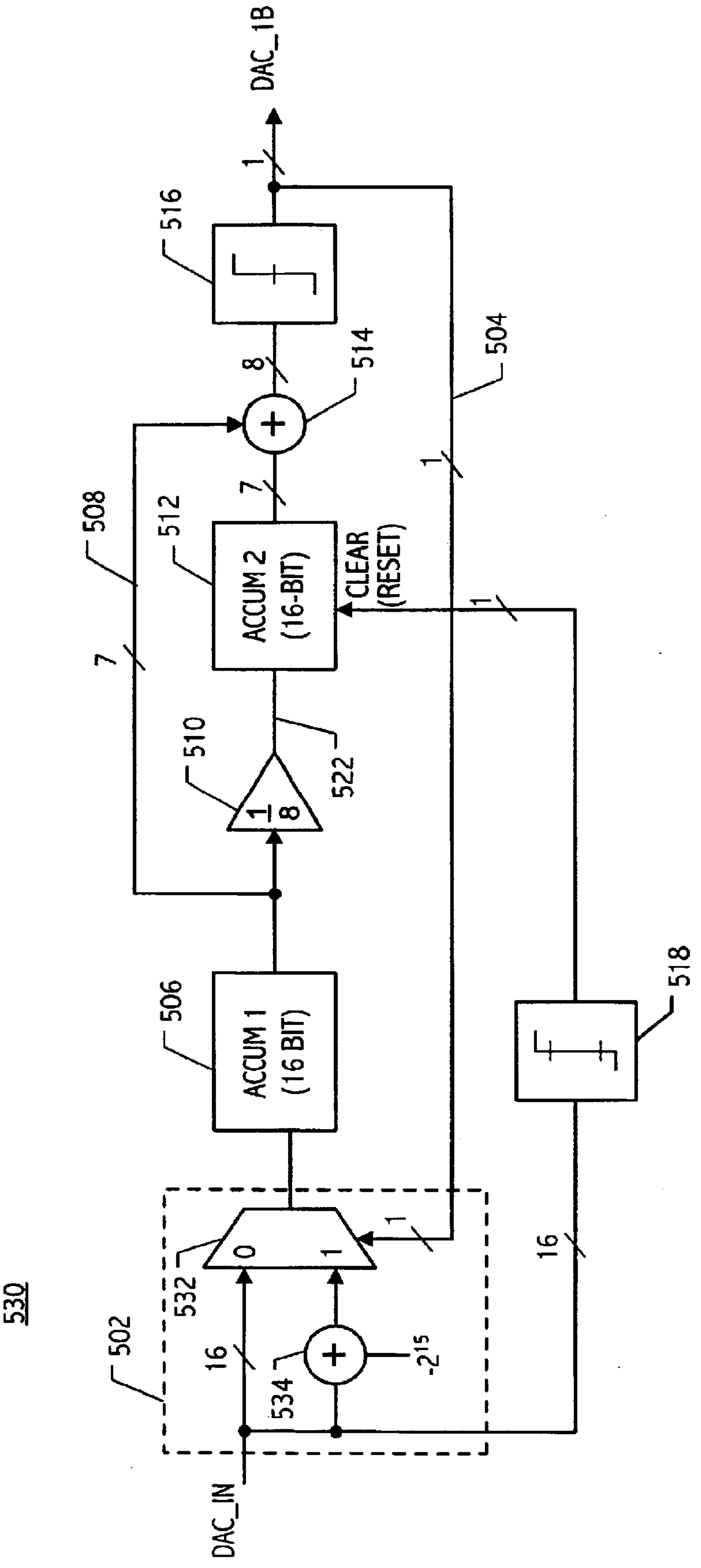
FIG. 24 is a block diagram of a hybrid first order/second order sigma-delta modulator circuit for use within a DAC such as those shown in FIG. 11.

In FIG. 24 a preferred embodiment is illustrated of a hybrid second order/first order sigma-delta modulator which includes a particularly convenient implementation of the summing block 502. In this embodiment a summing block 534 is configured to always subtract a constant value (here shown as $2^{15}$) from the digital input value, and a multiplexer 532 then chooses either the digital input value dacVal[15:0] or the result from the summing block 534 depending on the output of the comparator 516 conveyed on node 504. The constant value subtracted from the digital input value represents the full scale range of the digital input value dacVal [15:0]. Since the full scale range of the dacval[15:0] signal in this embodiment is chosen as having an upper limit of 1000_0000_0000_0000 (in other words, $2^{15}$), the constant value subtracted by the summing block 534 should also be $2^{15}$. Such a choice of this full scale range allows a much simpler summing block 534, as only the most significant bit on one of its operands is a non-zero bit. Nonetheless, other full scale reference values, such as $2^{16}-1$ (i.e., 1111_1111_1111_1111) may also be chosen, with a corresponding increase in complexity of the summing block 534.

In a preferred embodiment, such a hybrid sigma-delta modulator may be synthesized rather than hand-designed. An exemplary coding (e.g., again using the well-known Verilog™ language) for a hybrid sigma-delta modulator is shown in FIG. 25, which generally follows the block diagram representation shown in FIG. 24. Nonetheless, as with any coded representation of a circuit function, many different synthesized implementations are possible, depending upon compiler options selected, the semiconductor technology selected, performance requirements, layout requirements, etc. Consequently, the exemplary code is believed to map as well upon many possible implementations of actual circuit structures and related methods, including implementations not necessarily similar or identical to the block diagrams shown. The code is well documented and believed to be relatively instructive on its face, particularly given the block diagram introduction, but nonetheless several comments deserve mention.

After defining the various module interface variables in code section 570, an 8-bit accumSum is defined, which is analogous to the output of summing block 514, and both accumulators are defined as 16-bit registers. In code section 574, the upper 7 bits of both accumulators are added to yield an 8-bit result. By sign extending the upper 7 bits of each accumulator to form an 8-bit number, the addition operation need not deal with overflow issues.

In code section 576, the function of comparator 516 is implemented by testing the most significant bit of the accumSum value. If the accumSum[7] bit is equal to a logic 1 (i.e., representing a negative value for the sum), the input DacVal is added to the current value of the first accumulator accum1, and the output bit dac_1b is set to a logic 0. Conversely, if accumSum[7] is equal to a logic 0 (i.e., representing a positive value), the full scale reference value $2^{15}$ is subtracted from the input DacVal, which result is then added to the current value of the first accumulator accum1, and the output bit dac_1b is set to a logic 1. The subtraction is performed by (and coded as) merely inverting the most significant bit of the dacVal, which underscores why choosing the full scale upper limit of 1000_0000_0000_0000 for the dacVal is so convenient.

The above operation is valid for both operation as a first order sigma-delta modulator and as a second order modulator. In the remaining code sections, the DAC input value dacVal is tested, and if it is either close to zero or close to fall scale, the sigma-delta modulator is degraded to first order operation by forcing the second accumulator accum2 (representing the second accumulator 512 in FIG. 24) to zero. This test is performed in code section 582, which specifically tests the most significant 6 bits of the input value (e.g., dacVal[15:10]). If this bit string is equal to a concatentation of 000 and a 3-bit sdLimitLo variable, or if this bit string is greater than or equal to a concatentation of 011 and a 3-bit sdLimitHi variable, the accum2 is reset to all zeros. Preferably both the sdLimitLo and sdLimitHi variables are configurable, such as by a metal mask change, or by laser or electrical programming, or by specific configuration selection inputs. For example, if sdLimitLo=000, then the test at code section 582 detects when the input value is within the bottom-most 1/32 of the full scale range. Similarly, if sdLimitHi=111, then the test at code section 582 detects when the input value is within the top-most 1/32 of the full scale range. The middle portion of the dacVal range corresponding to second-order operation of the sigma-delta modulator may thus be advantageously set to 30/32 of the total range of values, with the sigma-delta modulator operating as a first-order modulator when the dacVal value is outside this middle portion of its range (i.e., within the upper 1/32 or the lower 1/32 of its range). Other advantageous middle portions may be chosen as well, including 14/16, and 6/8 of the total range.

In code section 584 the value of the first accumulator accum1 is shifted right by three bits with sign extension (to accomplish a 1/8 scaling factor) and sign extended an additional bit to yield a 17-bit number, and added to a 17-bit sign-extended version of the value of the accum2, to generate a temporary value accum2Sum. This temporary value is tested for over-flow and under-flow in code section 583 and the value of accum2 set accordingly to accomplish second order operation of the sigma-delta modulator.

Figure 26:
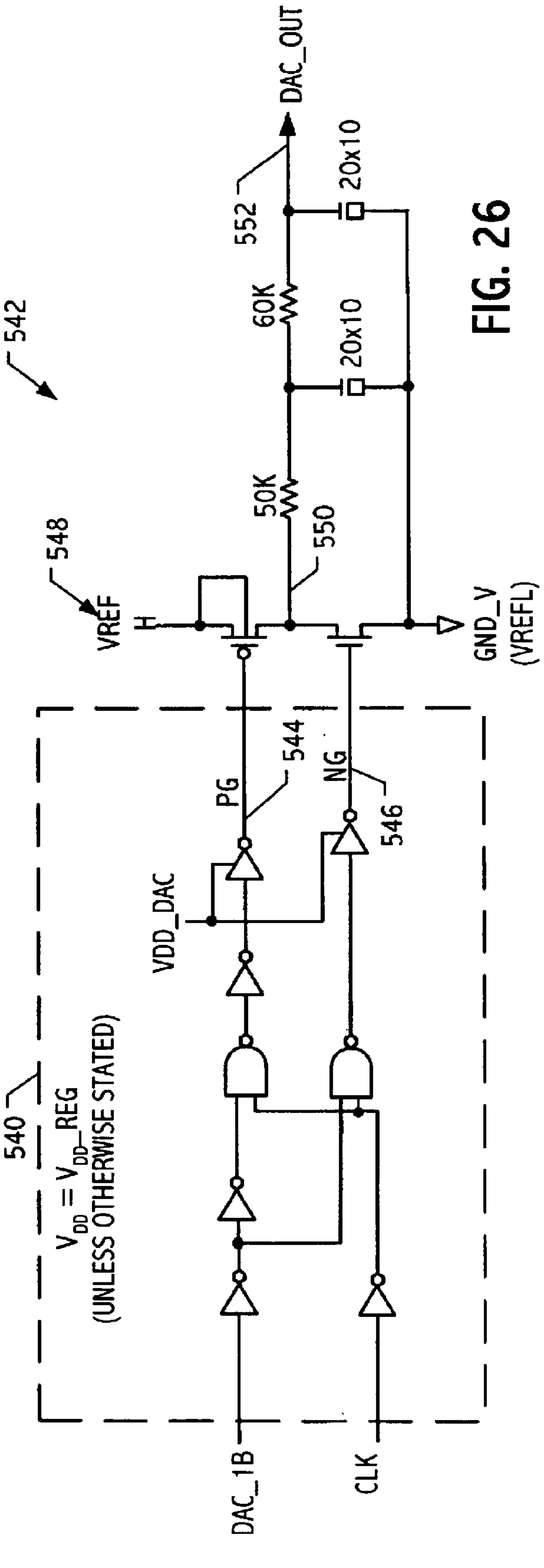
FIG. 26 illustrates an embodiment of NRZ-to-RZ coder circuit, push-pull stage, and second order RC filter for use within a DAC such as those shown in FIG. 11.

Referring again to FIG. 24, the sigma-delta modulator output signal dac_1b conveyed on node 504 is an AC signal which may be low-pass filtered to generate a stable analog output voltage for the DAC. Referring now to FIG. 26, additional circuitry is illustrated for a preferred embodiment of the DAC. In particular, an NRZ-to-RZ coder circuit 540 samples the dac_1b output signal and generates an active low pulse on a PG signal 544 when the dac_1b signal is high, and generates an active high pulse on a NG signal 546 when the dac_1b signal is low. The high and low level for both the PG signal and the NG signal is the same as the power supply levels for the DAC itself, which may be nominally the same value as other circuit portions but isolated from noise sources from the other portions, or may be a totally different value.

The PG signal and the NG signal are preferably coupled to drive a totem pole driver circuit 548, in this example having a P-channel pull-up transistor and an N-channel pull-down transistor, to generate an analog signal on node 550 which is driven more positive by each PG pulse, and driven incrementally more negative by each NG pulse. This analog signal 550 is filtered by a second-order low-pass RC filter 542 to generate a filtered analog output voltage DAC_OUT for the DAC. Other types and configurations of filters, both passive and active, may be employed as well to smooth the analog signal generated at node 550, and filters having higher orders than second-order may also be employed.

Figure 27:
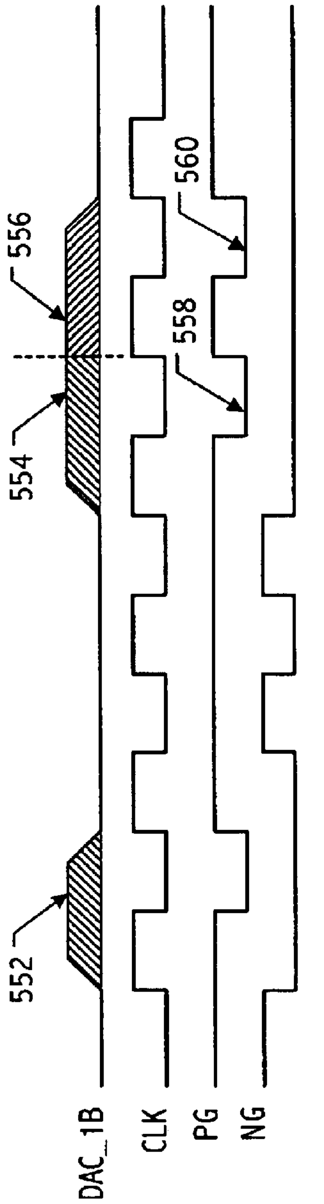
FIG. 27 is a timing diagram illustrating operation of the circuits shown in FIG. 26.

The usefulness of including such a RZ coder 540 between a sigma-delta modulator circuit and the low-pass filter circuit 542 is illustrated by the waveforms presented in FIG. 27. The top waveform shows an exemplary output waveform for the DAC_1B signal that includes a . . . 0100110 . . . data sequence. The single 1 bit is represented by pulse 552, which is depicted as having a risetime and falltime which are different. The two adjacent 1 bits are respectively represented by pulse 554 and pulse 556. Only pulse 554 has a risetime, which is typically identical to the risetime of pulse 552 (being driven, of course, by the same circuit), while only pulse 556 has a falltime, which is typically identical to the falltime of pulse 552.

If the DAC_1B signal is directly filtered to generate the analog output voltage, an error is introduced when the risetime and falltime of the DAC_1B signal are different. This error can be seen graphically by observing that the cross-hatched areas of pulse 554 and pulse 552 is a value other than exactly twice the area of pulse 552. In other words, the integral of the pulse waveform is distorted when two logic 1's are adjacent (and likewise when two logic 0's are adjacent), which is commonly referred to as an inter-symbol interference (ISI) distortion. By using the RZ coder circuit, the combined pulse (554 and 556) is converted to a pair of identical pulses 558 and 560, each with a rising edge and falling edge, so that the integral of the waveform is independent of bit adjacencies.

The techniques described above may be employed in a wide variety of PLL embodiments. One exemplary application which provides for a "hitless switching" of multiple input clock signals is provided in FIG. 15, which depicts a high speed clock generation integrated circuit 1500 for use with SONET line cards compliant with the Broadband ISDN (B-ISDN) standard or SDH line cards. In this embodiment, three independent 19.44 MHz system clocks 1502, 1504, and 1506 are provided to the clock generation integrated circuit 1500 as shown (though described with respect to three system clocks, other numbers of system clocks may alternatively be utilized). Two system input clocks, clock 1502 (CLKIN_A) and clock 1504 (CLKIN_B) are provided so that the clock generation integrated circuit 1500 may generate SONET/SDH compliant clock outputs. System input clock 1506 (BU_REFCLK) may be optionally used to determine frequency offset errors between the input clocks or be used as an additional input clock for the phase locked loop circuitry as described in more detail below. The clock generation integrated circuit 1500 operates to attenuate jitter at user selectable loop bandwidths, and output multiple clean clocks to the SONET/SDH line card. The multiple clean clocks are provided based upon a phase-locked clock multiplier arrangement. Four clock outputs 1510, 1512, 1514 and 1516 are provided as CLKOUT_0, CLKOUT_1 CLKOUT_2, and CLKOUT_3, respectively. Each clock output may be set to independently produce 19.44 MHz, 155.52 MHz or 622.08 MHz outputs (or 15/14 forward error correction (FEC) versions of the clocks). The frequency of each output clock may be set based upon a two bit frequency select signal provided for each clock at frequency select input pins of the integrated circuit 1500. Thus, two input pins are provided to accept the frequency select signal 1520 (FSEL_0) to control clock output 1510, two input pins are provided to accept the frequency select signal 1522 (FSEL_1) to control clock output 1512, two input pins are provided to accept the frequency select signal 1524 (FSEL_2) to control clock output 1514, and two input pins are provided to accept the frequency select signal 1526 (FSEL_0) to control clock output 1516. Based upon the two frequency select bits provided to each clock, each clock may be set to a clock driver power down mode, a 19.44 MHz output mode, a 155.52 MHz output mode or 622.08 MHz output mode. The output clocks may be presented with less than 1 $ps_{RMS}$ jitter over the OC-48 jitter measurement mask.

Additional details of the embodiment shown in FIG. 15, as well as other embodiments, are described in the above-referenced co-pending U.S. Patent Application by Yunteng Huang, et. al., entitled "Method and Apparatus for Switching Between Input Clocks in a Phase-Locked Loop."

Figure 28:
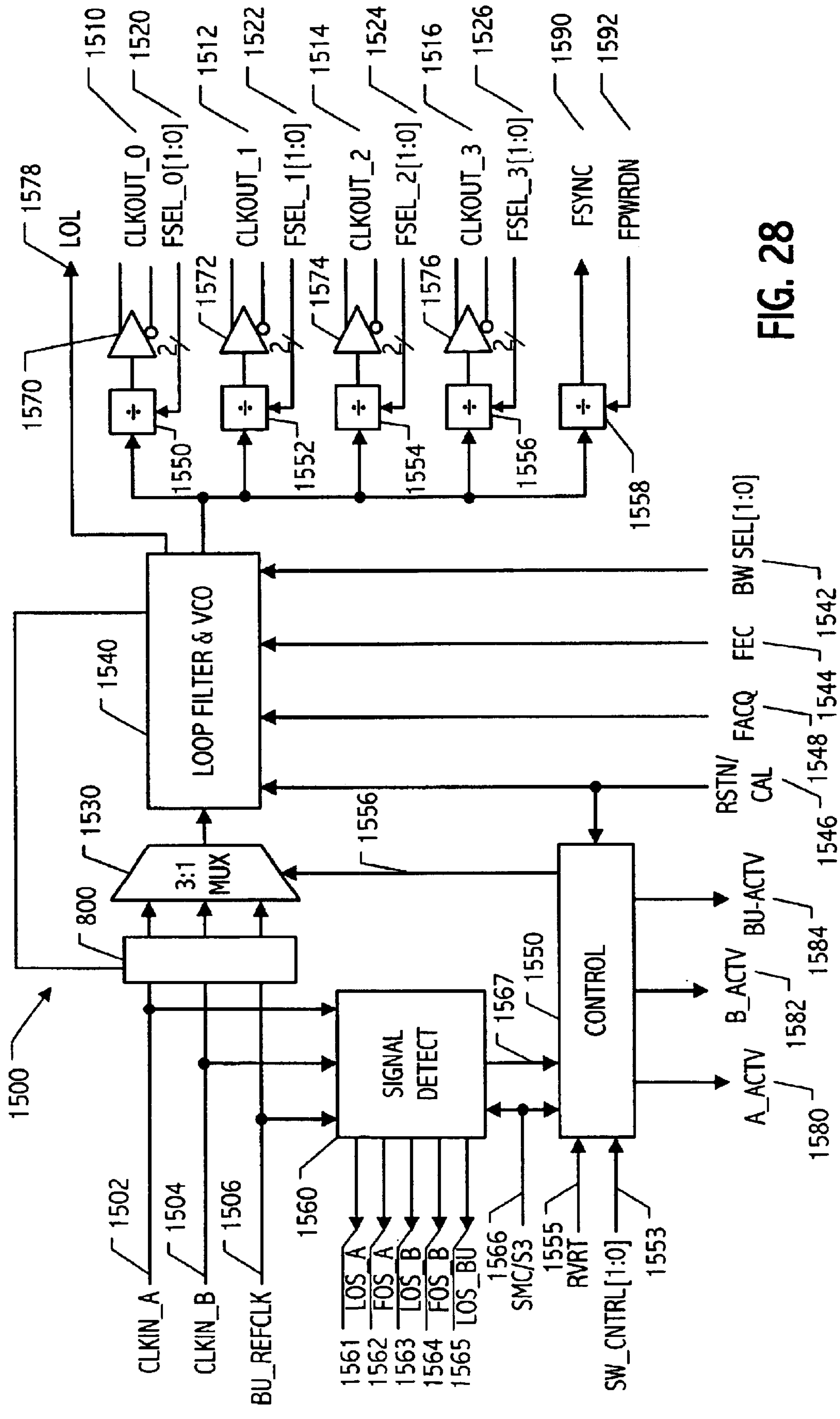
FIG. 28 illustrates an exemplary integrated circuit suitable for incorporating one or more of the embodiments described herein.

As shown in FIG. 28, each of the input clocks 1502, 1504, and 1506 are provided to input block 800, whose outputs are provided to multiplexer 1530. One of the outputs from block 800 is selected by multiplexer 1530 as the input to loop filer and VCO circuit 1540. A phase-locked loop is formed by input block 800, multiplexer 1530 and loop filter and VCO 1540 that multiplies one of the input clock signals and provides output clock signals. Multi-rate operation may be achieved by configuring the device to divide down the output of the PLL voltage controlled oscillator (VCO) to the desired clock rate. Thus, the output of the phase locked loop circuit 1540 is provided to clock divider circuits 1550, 1552, 1554, and 1556 which respond to the frequency selection signals 1520, 1522, 1524, and 1526 respectively to provide the appropriate divisor factor to obtain the desired output clock frequencies. Clock output drivers 1560, 1562, 1564, and 1566 may be current mode logic (CML) drivers for providing the high frequency differential clock outputs.

As will be described in more detail below, the phase locked loop circuit may be formed utilizing digital signal processing components. The use of digital signal processing (DSP) components in the PLL provides advantages as compared to many traditional analog PLL circuits including lowering jitter and noise and eliminating the need for external loop filter components found in traditional PLL implementations. The digital signal processing components may include the use of a DSP algorithm to replace the loop filter commonly found in analog PLL designs, as described in the above-referenced U.S. patent application Ser. No. 09/902,541. This algorithm processes the phase detector error term and generates a digital control value to adjust the frequency of the PLL's voltage controlled oscillator (VCO). The generation of control signals for the VCO is well suited to use of the digital expander and sigma-delta modulator techniques disclosed herein. Because external loop filter components are not required, sensitive noise entry points are eliminated thus making the PLL less susceptible to board-level noise sources. In addition, since the PLL technology includes digital components, the user may control certain loop parameters without the need to change components. For example, a two pin loop bandwidth selection input 1542 (BWSEL) is provided to the PLL 1540 so that a user may select one of three loop bandwidth settings (3200 Hz, 800 Hz, or 6400 Hz) for different system requirements. Lower bandwidth selection settings may result in more jitter attenuation of the incoming clock but may result in higher jitter generation. A forward error correction (FEC) pin 1540 may also be provided to enable an FEC mode by scaling the output of the PLL by a factor of 15/14.

One of the advantages of a digital implementation of a loop filter is its ability to place the PLL into a "hold" state. If a particular condition occurs, the digital accumulators described herein may be held at their current value by disabling their clocks (or by any other suitable technique) rather than be allowed to accumulate. Since the control signals for the VCO are digitally determined based upon the accumulator values, these VCO control signals may also be held at their current analog value, thus substantially "freezing" the state of the PLL. By using 128 sub-varactors, a wide tuning range may be achieved. In an exemplary embodiment, an uncalibrated nominal VCO frequency range of +/−15% may be observed, and once calibrated (using, for example, additional calibration varactors in the VCO), a +/−1.5% tuning range may be achieved. Based upon an exemplary nominal frequency of 2.5 GHz, such a 1.5% tuning range corresponds to a 75 MHz tuning range. To meet a 1 mUI phase error requirement, and assuming a 10 kHz loop bandwidth, the frequency error of the PLL may need to be as low as 60 Hz, and would suggest a DAC dynamic range requirement equal to (75 MHz)/(60 Hz)=122 dB. Achieving such a dynamic range with a single DAC is extremely difficult and would require a 21 bit DAC, but this overall dynamic range may be achieved using several DACs having lesser resolution, a VCO with multiple control inputs and non-linear varactor control circuits as described herein. The large dynamic range of the digital varactor techniques depicted herein allows the PLL to compensate for subsequent parametric variations, voltage variations, and temperature variations over time.

By generating the VCO control signals digitally, it is much easier to implement non-linear function in the PLL loop control. For example, system distortion could be compensated for in the digital generation of the VCO control signal lines. Predistortion may be added to compensate for non-linear behavior of the VCO or other components of the PLL.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Although certain implementation techniques (e.g., logic synthesis, etc.) are not specifically described, such techniques are well known, and no particular advantage is afforded by specific variations of such techniques in the context of practicing this invention. Conventional circuit design and layout tools may be used to implement the invention. The specific embodiments described herein, and in particular the various bit widths, register sizes, signed or unsigned format of certain digital values, and operating frequencies, are illustrative of exemplary embodiments, and should not be viewed as limiting the invention to such specific implementation choices. Accordingly, plural instances may be provided for components described herein as a single instance. Boundaries between various components, operations and circuits are somewhat arbitrary, and particular operations are illustrated in the context of specific illustrative configurations. Other allocations of functionality are envisioned and may fall within the scope of claims that follow. For example, in some realizations, certain aspects may be performed using circuit, under control of software, or using a combination of circuit and software functionality.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. Moreover, such claims are intended to read upon embodiments using more general purpose hardware under firmware or software control. Finally, structures and functionality presented as discrete components in the exemplary configurations may be implemented as a combined structure or component. The invention is contemplated to include circuits, systems of circuits, related methods, and computer-readable medium encodings of such circuits, systems, and methods, all as described herein, and as defined in the appended claims. As used herein, a computer readable medium includes at least disk, tape, or other magnetic, optical, semiconductor (e.g., compactflash cards, ROM), or electronic medium and a network, wireline, wireless or other communications medium.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the preferred embodiments are described in the context of a PLL operating at exemplary frequencies, the teachings of the present invention are believed advantageous for use with other types of circuitry in which a large number of analog signals need to be driven from a single control signal (analog or digital). Moreover, the techniques described herein may also applied to other types of circuit applications. Accordingly, other variations, modifications, additions, and improvements may fall within the scope of the invention as defined in the claims that follow.

What is claimed is:

1. A circuit comprising:

an input for receiving a first digital control word;

a plurality J of analog output voltage nodes;

a plurality K of digital-to-analog converter circuits (DACs);

wherein up to a selected number K of the analog output voltage nodes are coupled to an associated DAC whose output value is within an inclusive range from Vmin to Vmax;

wherein remaining non-selected analog output voltage nodes are coupled to a value of either Vmin or Vmax;

wherein a respective control word provided to each of the DACs is determined by at least the first digital control word; and wherein the selected analog output voltage nodes are determined by a second digital control word.

2. The invention as in claim 1 wherein:

K is less than J.

3. The invention as in claim 2 wherein:

at most one of the plurality K of DACs is rolled at a time from one of the selected analog output voltage nodes to a newly selected analog output voltage node.

4. The circuit as in claim 1 further comprising a multiplexer circuit having a plurality K of inputs for receiving a respective one of the plurality K of DAC output values, and having a pair of inputs for receiving Vmin and Vmax, respectively, said multiplexer circuit for coupling the K DAC output values to selected ones of the plurality J of analog output voltage nodes, and coupling remaining ones of the plurality J of analog output voltage nodes to either Vmin or Vmax.

5. The circuit as in claim 4 wherein:

no more than N analog output voltage nodes are at any time at an intermediate voltage between Vmin and Vmax, and each of such N analog output voltage nodes is coupled to a respective output node of an associated one of the plurality K of DACs; and N is less than K.

6. The invention as in claim 1 wherein:

K is equal to J.

7. The circuit as in claim 1 wherein at least one of the selected analog output voltage nodes is at an intermediate voltage between Vmin and Vmax, and is coupled to a respective output node of an associated one of the plurality K of DACs.

8. A circuit for generating a plurality of control signals, each responsive to a first digital control word, said circuit comprising:

a digital voltage expander having an input for receiving the first digital control word, and having a plurality of digital outputs conveying a corresponding plurality of digital output values;

a plurality of digital-to-analog converter circuits (DACs), each having an input coupled to receive a corresponding one of the plurality of digital output values;

a plurality J of analog output voltage nodes for conveying the control signals;

wherein up to a selected number K of the analog output voltage nodes are coupled to an associated DAC whose output value is within the inclusive range of Vmin to Vmax;

wherein remaining non-selected analog output voltage nodes are coupled to a value of either Vmin or Vmax; and wherein the control word provided to each of the DACs coupled thereto is determined by at least the first digital control word.

9. The circuit as in claim 8 further comprising a multiplexer circuit having a plurality K of inputs for receiving a respective one of the plurality of DAC output values, and having a pair of inputs for receiving Vmin and Vmax voltage levels, respectively, said multiplexer circuit for coupling the DAC output values to selected ones of the plurality J of analog output voltage nodes, and coupling remaining ones of the plurality J of analog output voltage nodes to either the Vmin level or the Vmax level.

10. The circuit as in claim 9 wherein:

no more than N analog output voltage nodes are at any time at an intermediate voltage between Vmin and Vmax, and each of such N analog output voltage nodes is coupled to a respective output node of an associated one of the plurality (numbering K) of DACs; and N is less than K.

11. The invention as in claim 8 wherein:

the selected analog output voltage nodes are determined by a second digital control word different than the first digital control word.

12. The invention as in clam 8 wherein:

each control signal is sequentially driven from Vmin to Vmax in response to increasing values of the first digital control word; and the value of each control signal overlaps that of positionally adjacent control signals.

13. The circuit as in claim 8 wherein at least one of the selected analog output voltage nodes is at an intermediate voltage between Vmin and Vmax, and is coupled to a respective output node of an associated one of the plurality of DACS.

* * * * *

UNITED STATES PATENT AND TRADEMARK OFFICE

CERTIFICATE OF CORRECTION

PATENT NO. : 6,825,785 B1

DATED : November 30, 2004

INVENTOR(S) : Yunteng Huang, Bruno W. Garlepp and David R. Welland

It is certified that error appears in the above-identified patent and that said Letters Patent is hereby corrected as shown below:

Title page,
Item [75], Inventors, after "Bruce W. Garlepp" insert -- David R. Welland, Austin, TX (US) --.

Column 30,
Line 65, "DACS" should read -- DACs --.

Signed and Sealed this

Fourth Day of April, 2006

JON W. DUDAS

*Director of the United States Patent and Trademark Office*